(12) United States Patent
Mitsuhashi

(10) Patent No.: US 8,691,686 B2
(45) Date of Patent: Apr. 8, 2014

(54) METHOD OF MANUFACTURING SEMICONDUCTOR DEVICE, SEMICONDUCTOR DEVICE, AND ELECTRONIC APPARATUS

(75) Inventor: Ikue Mitsuhashi, Kanagawa (JP)

(73) Assignee: Sony Corporation (JP)

( * ) Notice: Subject to any disclaimer, the term of this patent is extended or adjusted under 35 U.S.C. 154(b) by 122 days.

(21) Appl. No.: 13/439,020

(22) Filed: Apr. 4, 2012

(65) Prior Publication Data

US 2012/0256319 A1    Oct. 11, 2012

(30) Foreign Application Priority Data

Apr. 11, 2011    (JP) ................................. 2011-087053

(51) Int. Cl.
*H01L 21/4763* (2006.01)
(52) U.S. Cl.
USPC .......................................... 438/634; 438/629
(58) Field of Classification Search
USPC ................................ 438/634, 629
See application file for complete search history.

(56) References Cited

FOREIGN PATENT DOCUMENTS

| JP | 2005-150463 | 6/2005 |
| JP | 2008-182142 | 8/2008 |
| JP | 2010-245506 | 10/2010 |

*Primary Examiner* — Douglas Menz
(74) *Attorney, Agent, or Firm* — Sheridan Ross P.C.

(57) ABSTRACT

A method of manufacturing a semiconductor device, includes: forming a first circuit substrate having a first interconnection; forming a second circuit substrate having a second interconnection; bonding the first circuit substrate to the top surface of the second circuit substrate so as to be stacked facing each other; and performing an etching process of simultaneously removing parts formed on the first interconnection and the second interconnection in a stacked body of the first circuit substrate and the second circuit substrate so as to form a first opening in the top surface of the first interconnection and to form a second opening in the top surface of the second interconnection. The forming of the first circuit substrate includes forming an etching stopper layer on the surface of the first interconnection out of a material having an etching rate lower than that of the first interconnection in the etching process.

7 Claims, 25 Drawing Sheets

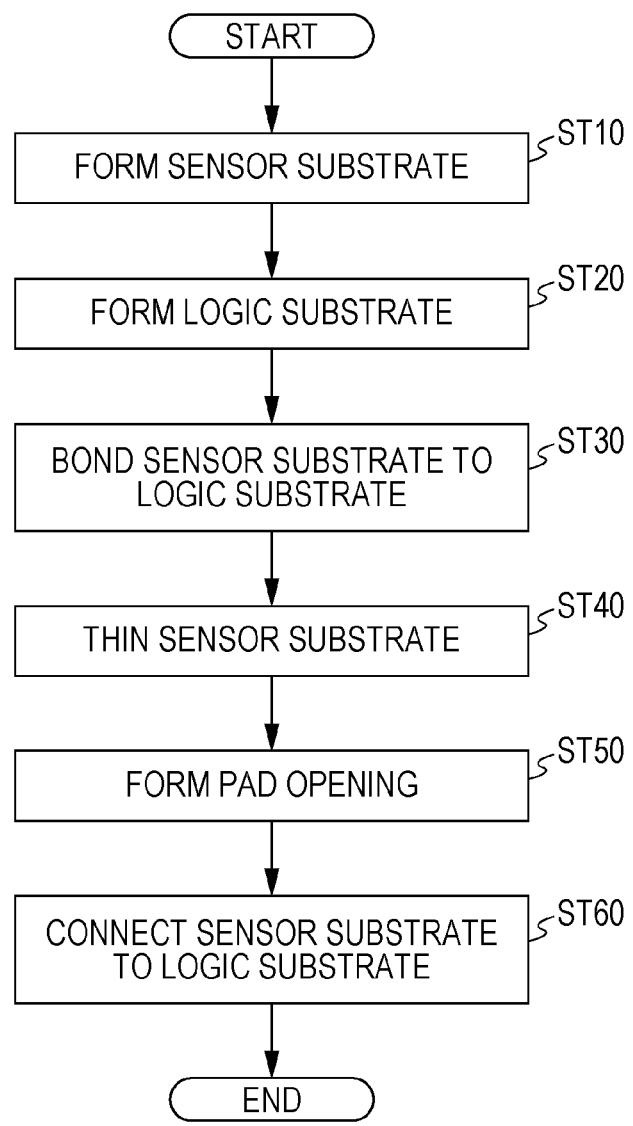

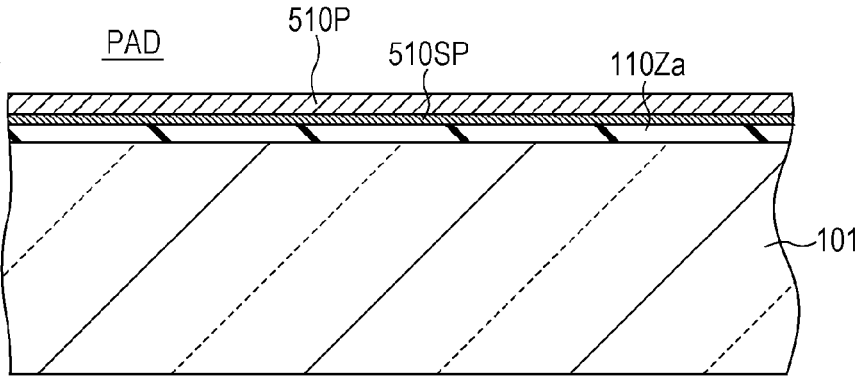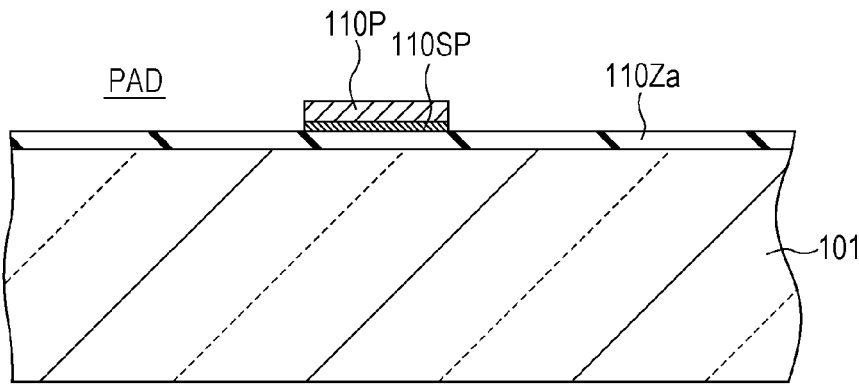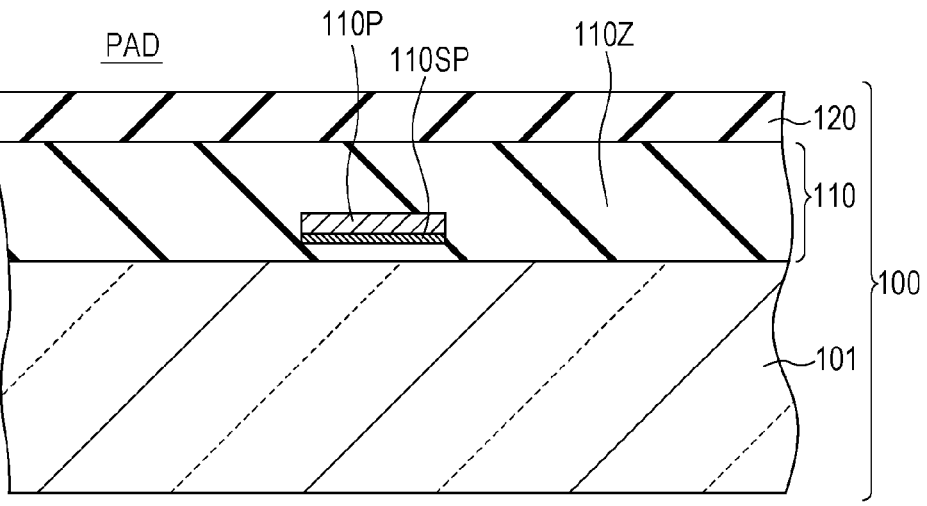

ST20

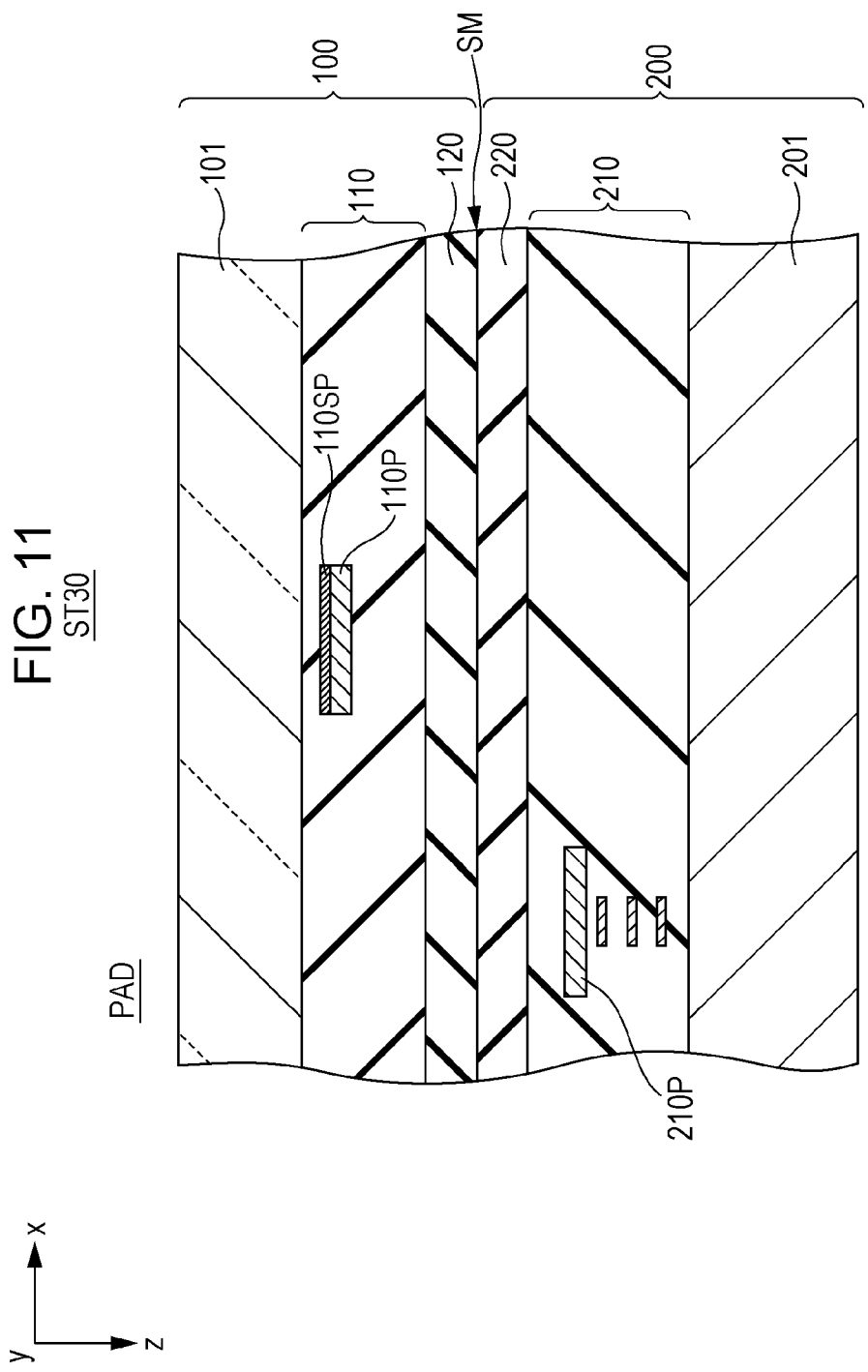

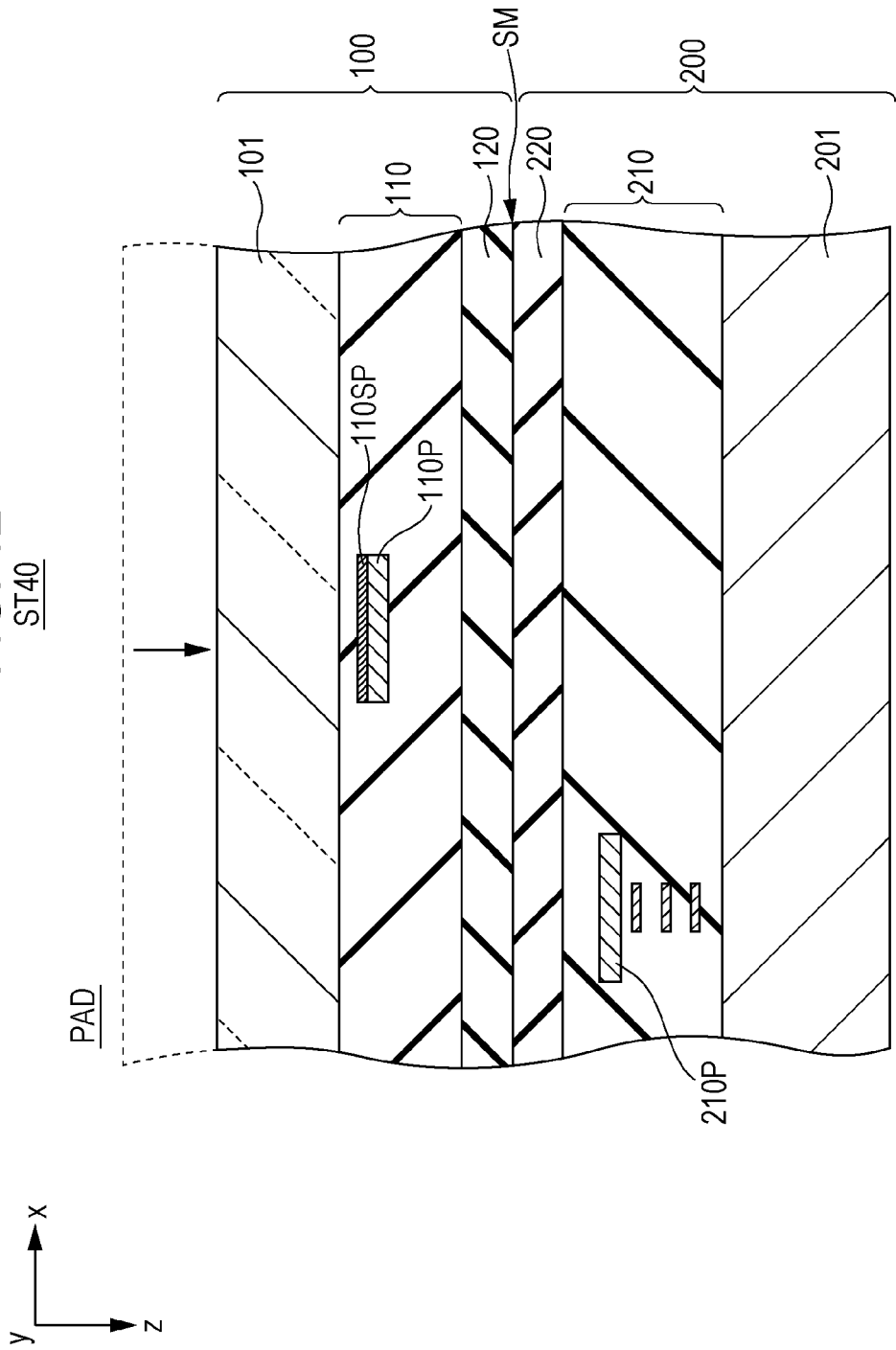

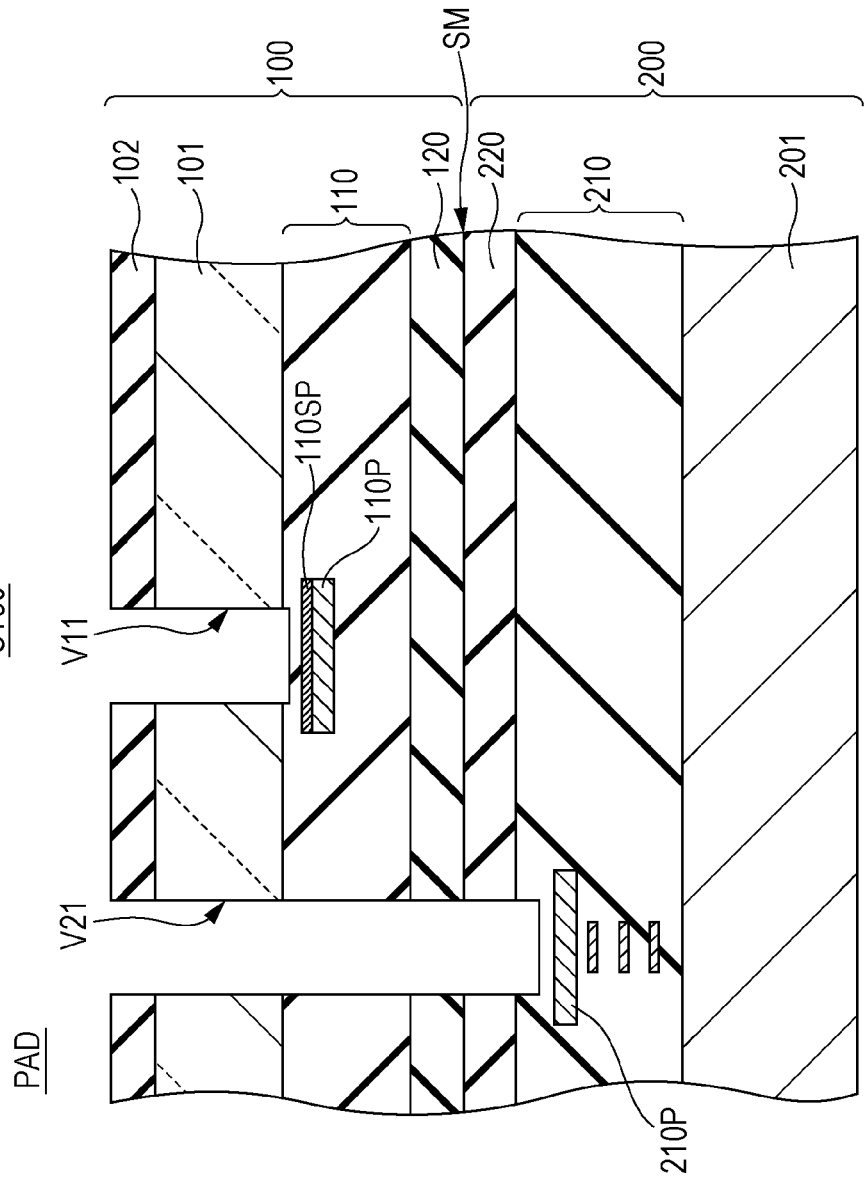

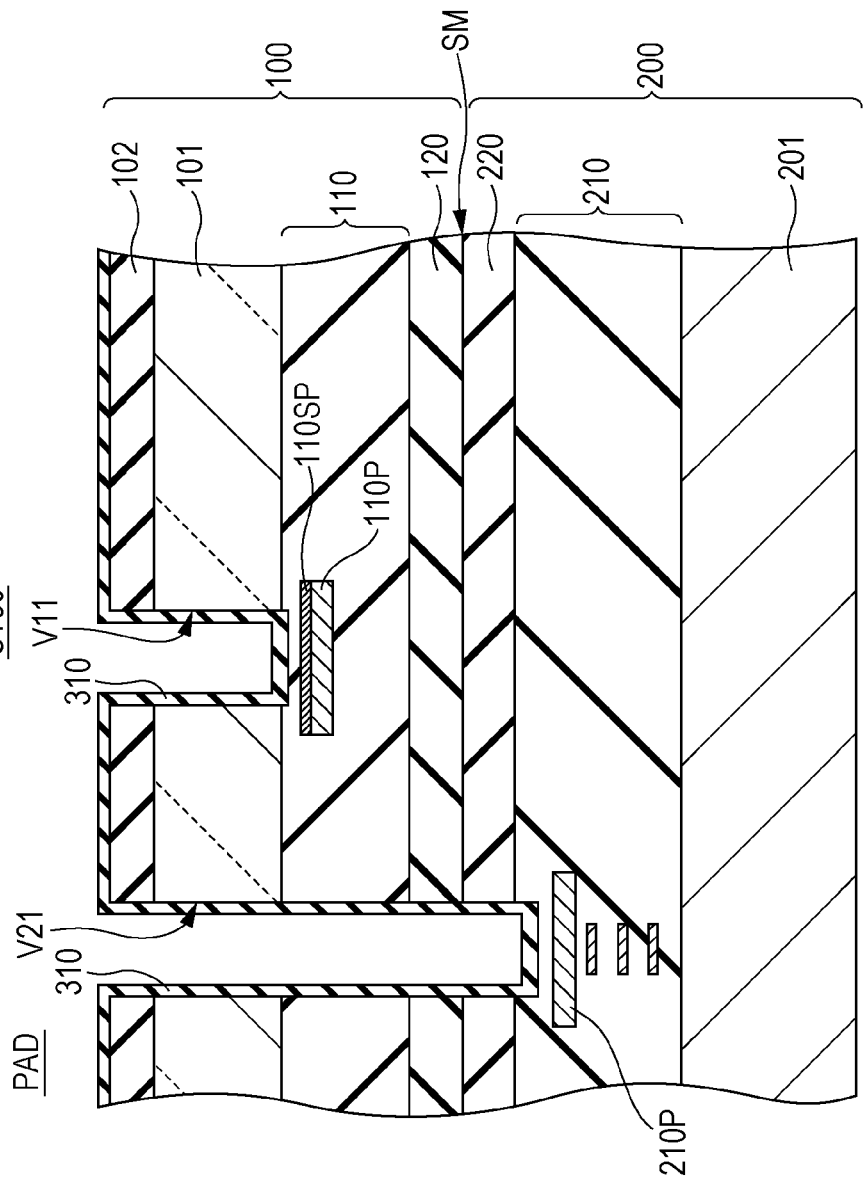

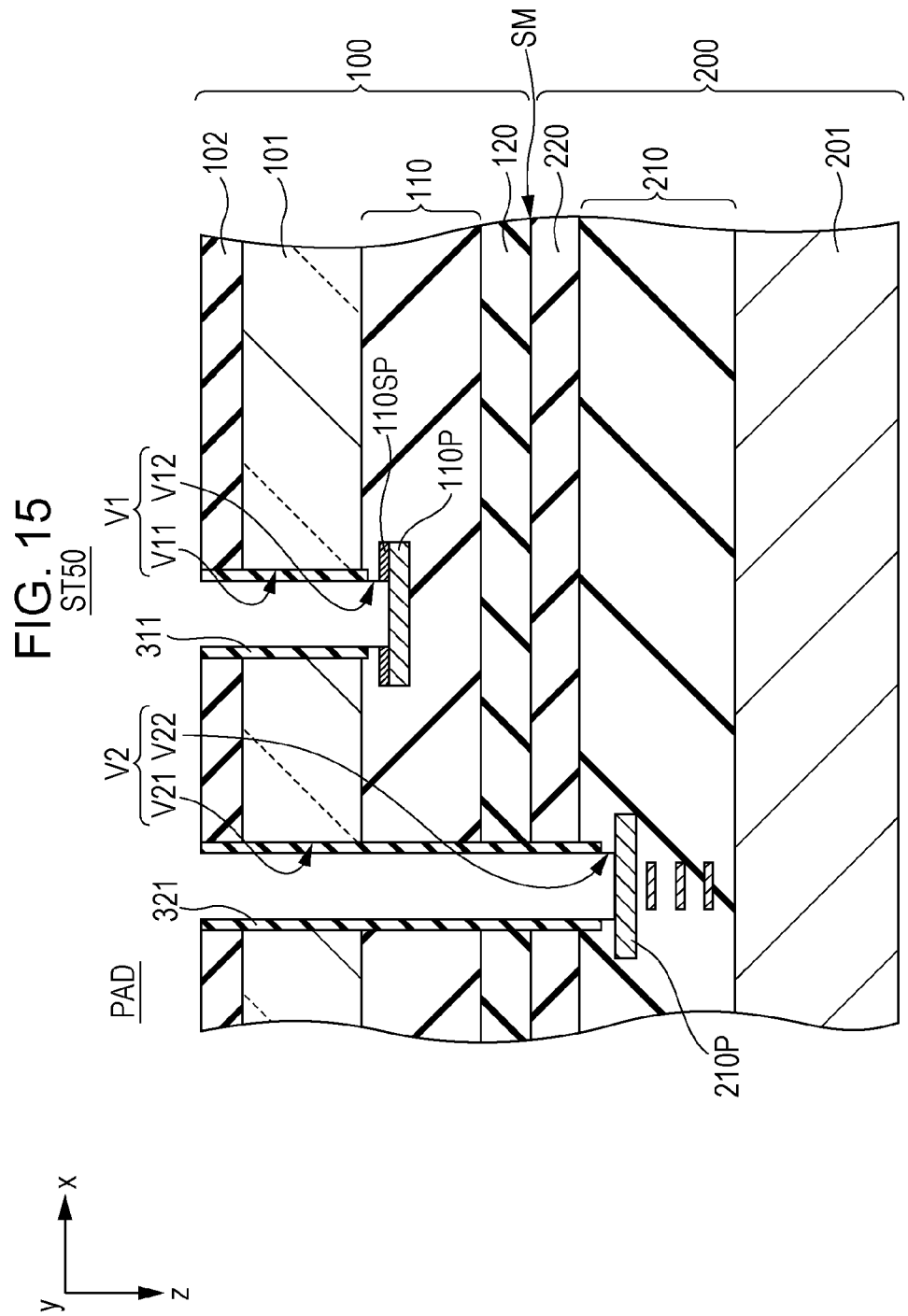

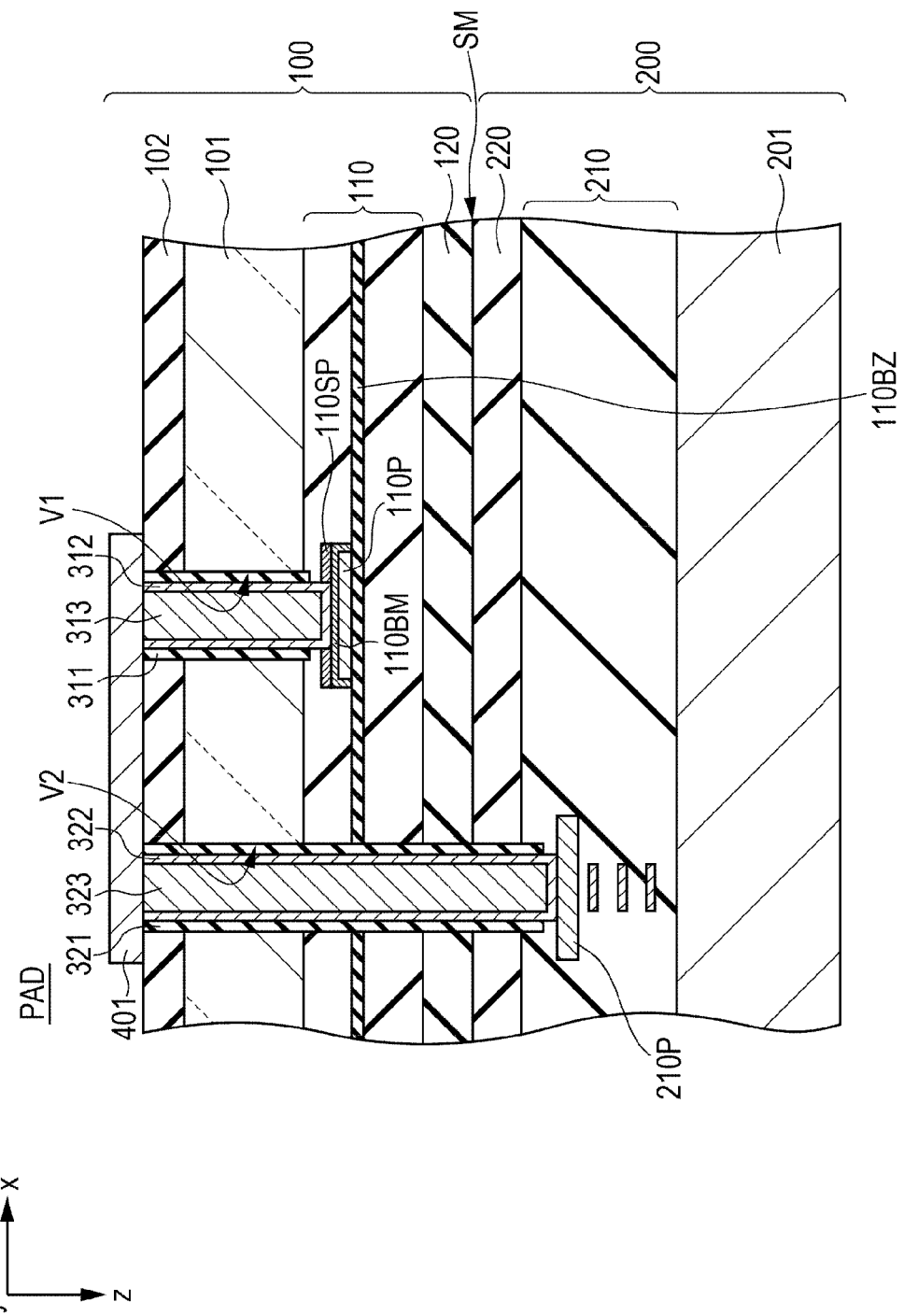

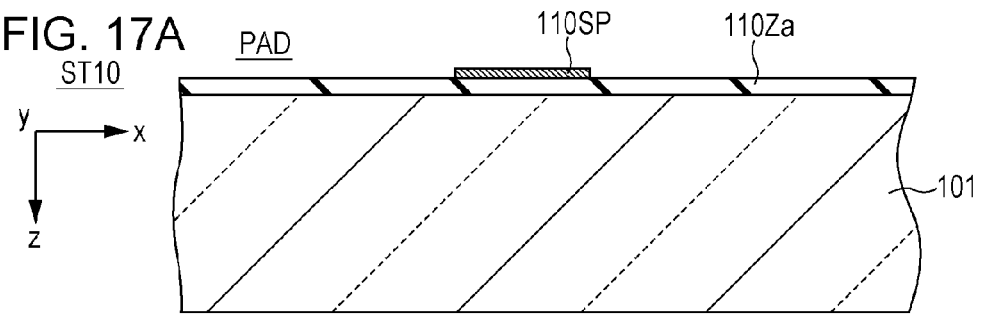
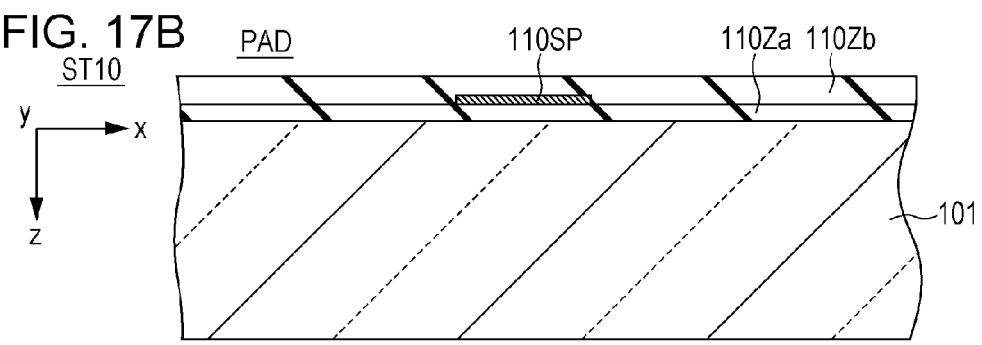
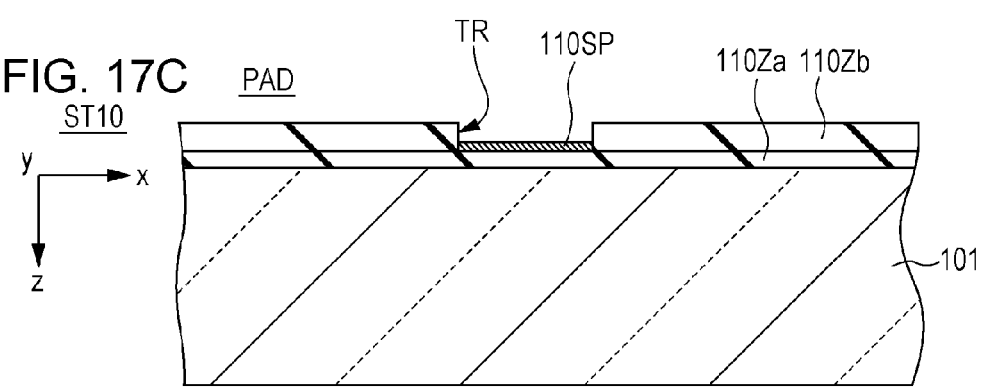

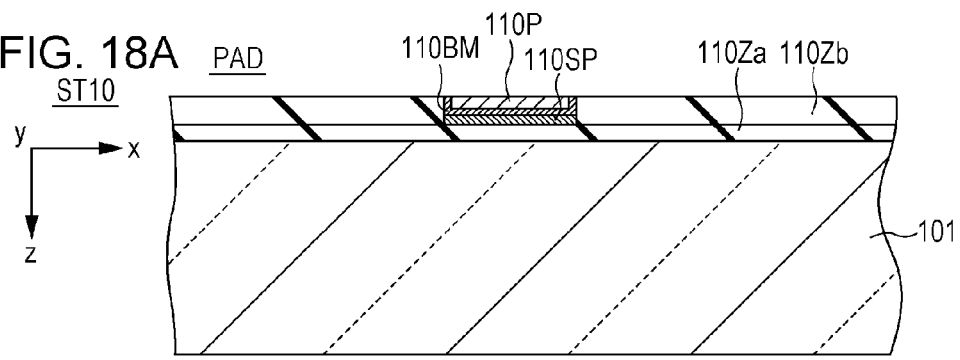
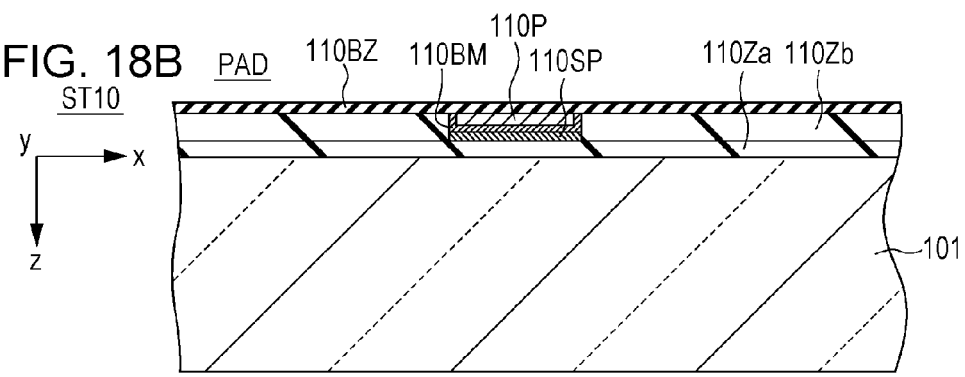
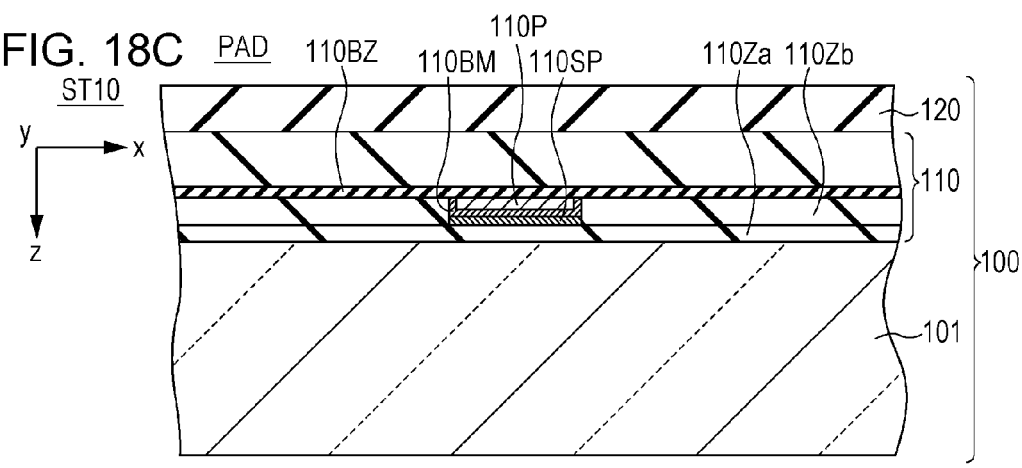

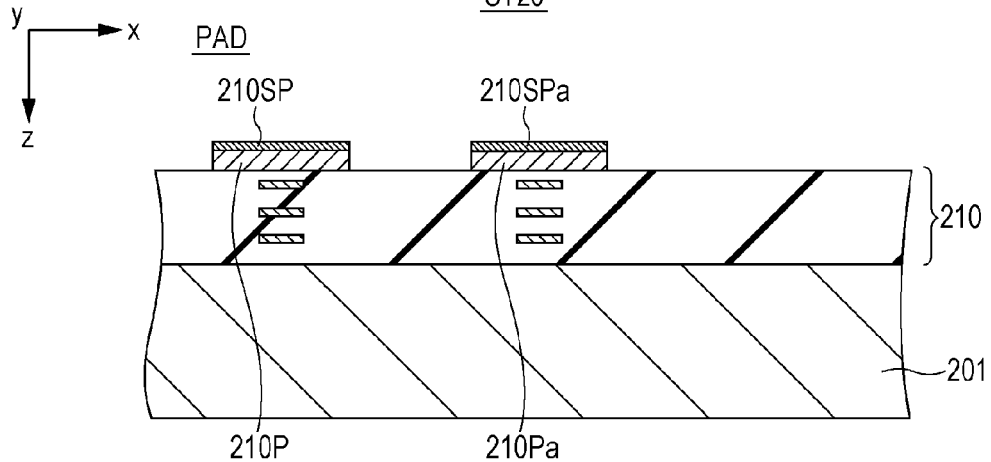
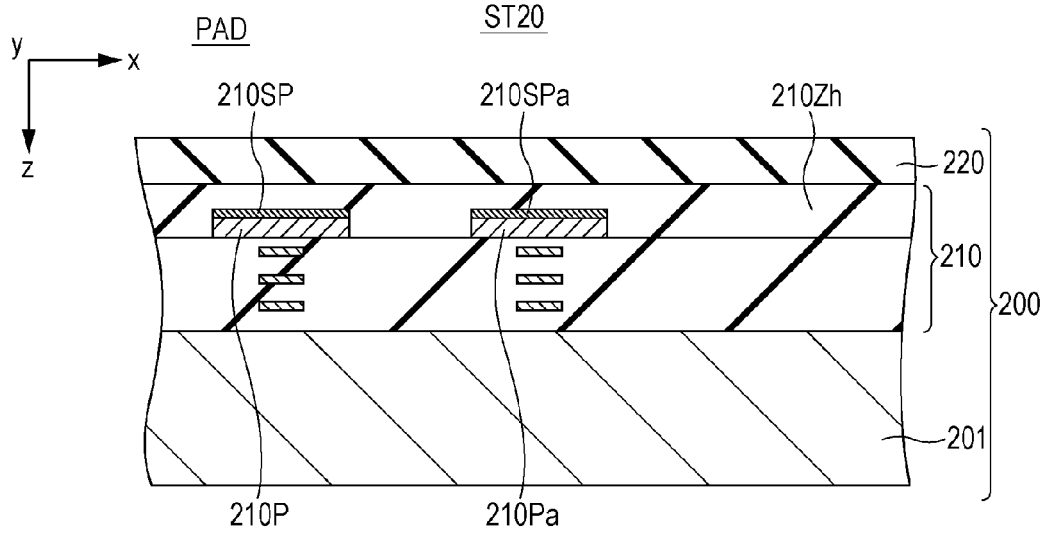

ST50

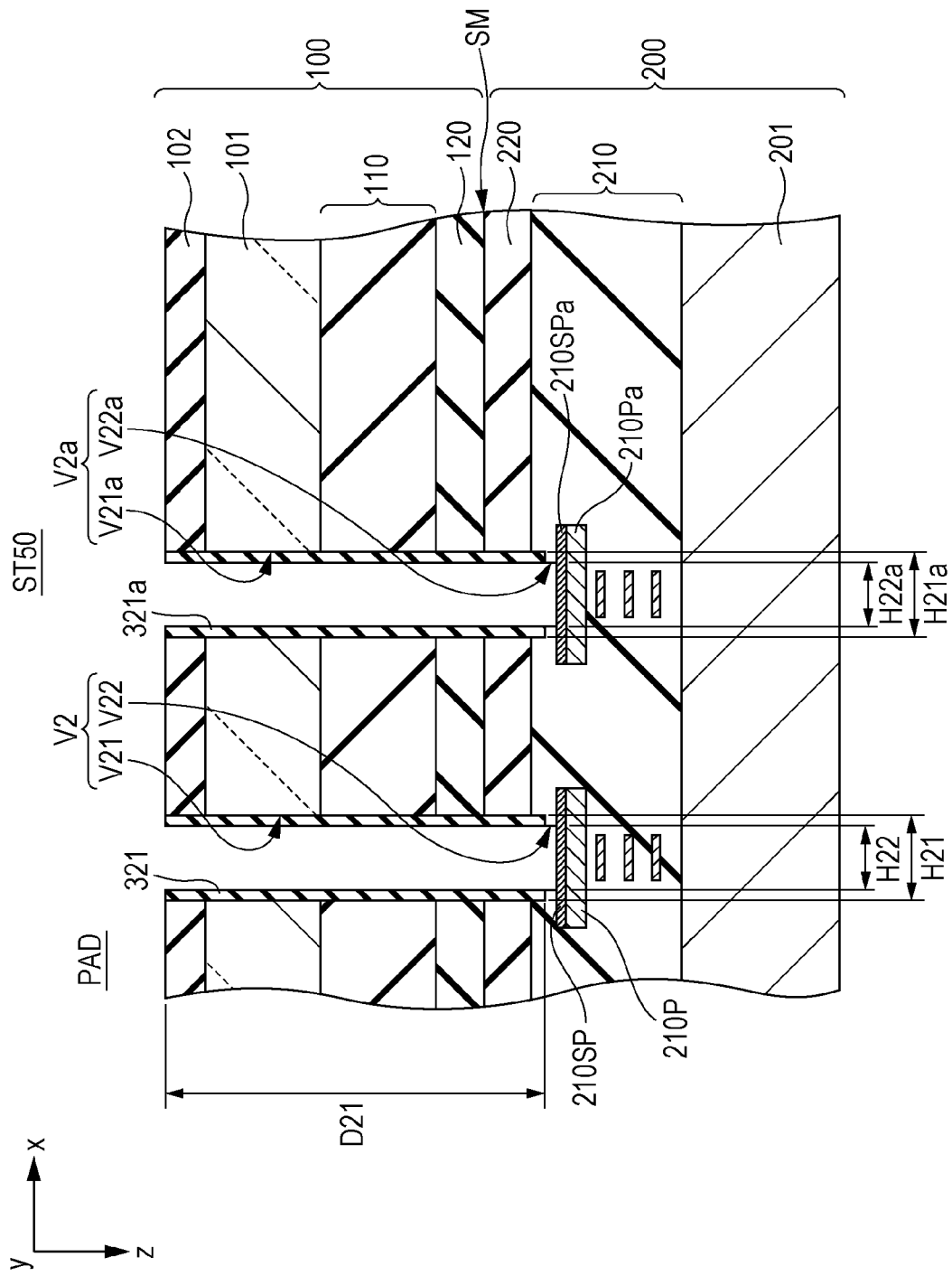

METHOD OF MANUFACTURING SEMICONDUCTOR DEVICE, SEMICONDUCTOR DEVICE, AND ELECTRONIC APPARATUS

BACKGROUND

The present disclosure relates to a method of manufacturing a semiconductor device, a semiconductor device, and an electronic apparatus.

Electronic apparatuses such as a digital video camera and a digital still camera include a semiconductor device such as a solid-state imaging device. Examples of the solid-state imaging device include a CMOS (Complementary Metal Oxide Semiconductor) image sensor and a CCD (Charge Coupled Device) image sensor.

In the solid-state imaging device, plural pixels are arranged in the surface of a semiconductor substrate. Each pixel includes a photoelectric conversion element. The photoelectric conversion element is, for example, a photodiode and generates a signal charge by receiving light incident via an external optical system through the use of a light-receiving surface and photoelectrically converting the received light.

In solid-state imaging devices, in general, light incident from the surface of the semiconductor substrate on which circuits or interconnections are formed is received by the photoelectric conversion element. In this case, since the circuits or interconnections block the incident light, it may be difficult to improve photosensitivity. Accordingly, a "backside illumination type" has been proposed in which light incident from the rear surface opposite to the surface of a semiconductor substrate on which circuits or interconnections are formed is received by photoelectric conversion elements (for example, see Japanese Unexamined Patent Application Publication Nos. 2005-150463 and 2008-182142).

In a semiconductor device such as the solid-state imaging device, "three-dimensional mounting" has been proposed in which plural substrates having different functional elements formed thereon are stacked and are electrically connected to each other. In "three-dimensional mounting", since optimal circuits corresponding to the functions are formed on the substrates, it is possible to easily realize an enhancement in the performance of the device. For example, a sensor substrate having sensor elements formed thereon and a logic substrate having logic circuits, which process signals output from the sensor elements, formed thereon are stacked to construct a solid-state imaging device. Here, pad openings are formed by penetrating the semiconductor substrate so as to expose the surface of a pad interconnection and the elements are electrically connected to each other via the pad openings. That is, the sensor substrate and the logic substrate are electrically connected to each other via a TSV (Through Silicon Via) (for example, see Japanese Unexamined Patent Application Publication No. 2010-245506).

SUMMARY

However, in the semiconductor device such as the solid-state imaging device, it is difficult to satisfactorily improve device reliability or production yield.

Accordingly, it is desirable to provide a method of manufacturing a semiconductor device, a semiconductor device, and an electronic apparatus, which can improve device reliability or production yield.

According to an embodiment of the present disclosure, there is provided a method of manufacturing a semiconductor device, including: forming a first circuit substrate having a first interconnection formed therein; forming a second circuit substrate having a second interconnection formed therein; bonding the first circuit substrate to the top surface of the second circuit substrate so as to be stacked facing each other; and performing an etching process of simultaneously removing parts formed on the first interconnection and the second interconnection in a stacked body of the first circuit substrate and the second circuit substrate so as to form a first opening in the top surface of the first interconnection and to form a second opening in the top surface of the second interconnection, wherein the forming of the first circuit substrate includes forming an etching stopper layer on the surface of the first interconnection out of a material having an etching rate lower than that of the first interconnection in the etching process.

According to another embodiment of the present disclosure, there is provided a semiconductor device including: a stacked body that includes a first circuit substrate and a second circuit substrate and in which the first circuit substrate is bonded to the top surface of the second circuit substrate so as to be stacked facing each other, wherein the stacked body includes at least a first interconnection having a first opening formed in the surface thereof and a second interconnection having a second opening formed in the surface thereof, wherein the first interconnection is disposed above the second interconnection in the stacked body, wherein the first opening and the second opening are formed through the use of an etching process of simultaneously removing parts on the first interconnection and the second interconnection, and wherein the first opening is formed by stopping the etching process by the use of an etching stopper layer formed on the top surface of the first inconnection out of a material having an etching rate lower than that of the first interconnection.

In these configurations, the first circuit substrate having the first interconnection formed therein is formed. The second circuit substrate having the second interconnection formed therein is formed. The first circuit substrate is bonded to the top surface of the second circuit substrate so as to be stacked facing each other. The etching process of simultaneously removing the parts on the first interconnection and the second interconnection in the stacked body is performed so as to form the first opening in the surface of the first interconnection and to form the second opening in the surface of the second interconnection. When forming the first circuit substrate, the etching stopper layer is formed on the top surface of the first interconnection out of the material having an etching rate lower than that of the first interconnection in the etching process. Accordingly, the first interconnection is protected with the etching stopper layer in the etching process.

According to still another embodiment of the present disclosure, there is provided a method of manufacturing a semiconductor device, including: forming a first circuit substrate; forming a second circuit substrate having a first interconnection and a second interconnection formed therein; bonding the first circuit substrate to the top surface of the second circuit substrate so as to be stacked facing each other; and performing an etching process of simultaneously removing parts formed on the first interconnection and the second interconnection in a stacked body of the first circuit substrate and the second circuit substrate so as to form a first opening on the top surface of the first interconnection and to form a second opening narrower than the first opening on the top surface of the second interconnection, wherein the forming of the second circuit substrate includes forming an etching stopper layer on at least the top surface of the first interconnection out of a material having an etching rate lower than that of the first interconnection in the etching process.

According to still another embodiment of the present disclosure, there is provided a semiconductor device including: a stacked body that includes a first circuit substrate and a second circuit substrate and in which the first circuit substrate is bonded to the top surface of the second circuit substrate so as to be stacked facing each other, wherein the stacked body includes at least a first interconnection having a first opening formed in the surface thereof and a second interconnection having a second opening being narrower than the first opening and being formed in the surface thereof, wherein the first opening and the second opening are formed through the use of an etching process of simultaneously removing parts on the first interconnection and the second interconnection, and wherein the first opening is formed by stopping the etching process by the use of an etching stopper layer formed on the top surface of the first interconnection out of a material having an etching rate lower than that of the first interconnection.

In these configurations, the first circuit substrate is formed. The second circuit substrate having the first interconnection and the second interconnection formed therein is formed. The first circuit substrate is bonded to the top surface of the second circuit substrate so as to be stacked facing each other. The etching process of simultaneously removing the parts on the first interconnection and the second interconnection in the stacked body is performed so as to form the first opening in the surface of the first interconnection and to form the second opening narrower than the first opening in the surface of the second interconnection. In the forming of the second circuit substrate, the etching stopper layer is formed on at least the top surface of the first interconnection out of the material having an etching rate lower than that of the first interconnection in the etching process. Accordingly, the first interconnection is protected with the etching stopper layer in the etching process.

According to the embodiments of the present disclosure, it is possible to provide a method of manufacturing a semiconductor device, a semiconductor device, and an electronic apparatus, which can improve device reliability and production yield.

BRIEF DESCRIPTION OF THE DRAWINGS

FIG. 8 is a diagram illustrating a part of a method of manufacturing the solid-state imaging device according to Embodiment 1.

FIGS. 9A to 9C are diagrams illustrating a part of the method of manufacturing the solid-state imaging device according to Embodiment 1.

FIG. 11 is a diagram illustrating a part of the method of manufacturing the solid-state imaging device according to Embodiment 1.

FIG. 12 is a diagram illustrating a part of the method of manufacturing the solid-state imaging device according to Embodiment 1.

FIG. 13 is a diagram illustrating a part of the method of manufacturing the solid-state imaging device according to Embodiment 1.

FIG. 14 is a diagram illustrating a part of the method of manufacturing the solid-state imaging device according to Embodiment 1.

FIG. 15 is a diagram illustrating a part of the method of manufacturing the solid-state imaging device according to Embodiment 1.

FIG. 16 is a diagram illustrating a partial configuration of a solid-state imaging device according to Embodiment 2.

FIGS. 17A to 17C are diagrams illustrating a part of the method of manufacturing the solid-state imaging device according to Embodiment 2.

FIGS. 18A to 18C are diagrams illustrating a part of the method of manufacturing the solid-state imaging device according to Embodiment 2.

FIGS. 22A to 22C are diagrams illustrating a part of the method of manufacturing the solid-state imaging device according to Embodiment 4.

FIG. 25 is a diagram illustrating a part of the method of manufacturing the solid-state imaging device according to Embodiment 4.

DETAILED DESCRIPTION OF EMBODIMENTS

Exemplary embodiments will be described below with reference to the accompanying drawings.

The description will be made in the following order.
1. Embodiment 1 (with Different Depth of TSV)
2. Embodiment 2 (with Different Depth of TSV)
3. Embodiment 3 (with Different Depth of TSV)
4. Embodiment 4 (with Different Depth of TSV)
5. Others 1. Embodiment 1

A. Device Configuration

A-1. Partial Configuration of Camera

Figure 1:
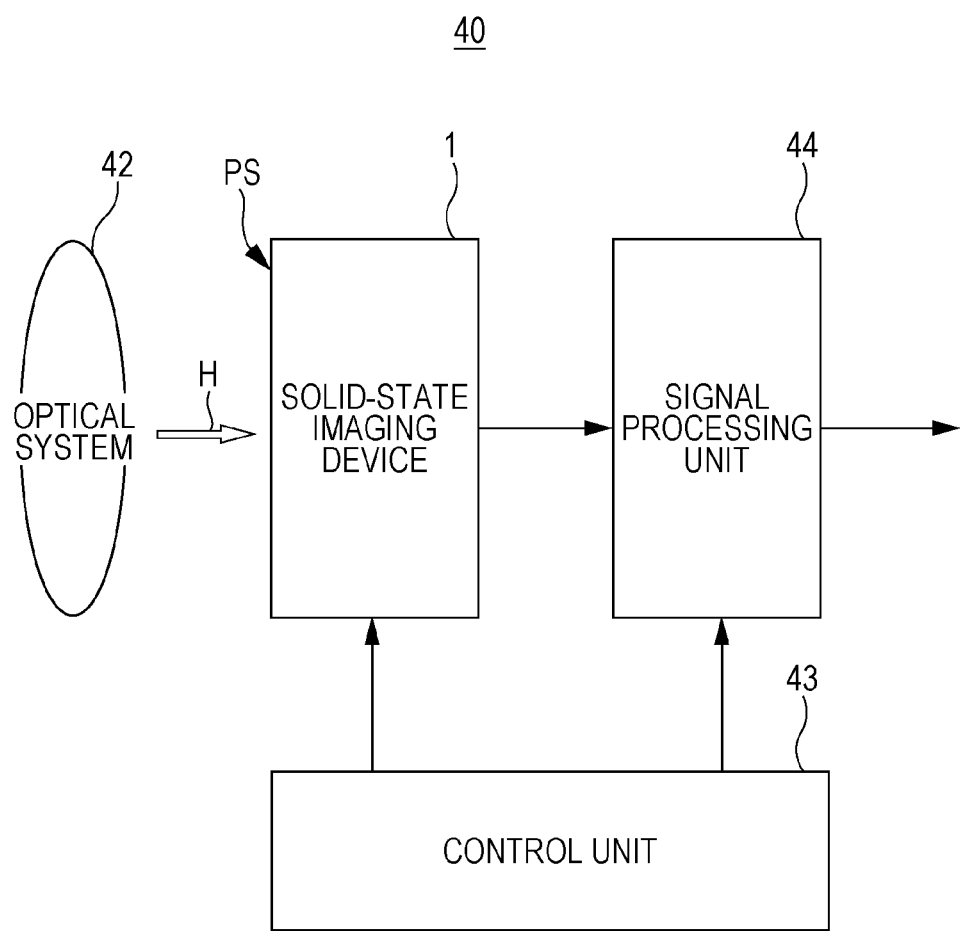
FIG. 1 is a diagram illustrating the configuration of a camera according to Embodiment 1.

FIG. 1 is a diagram illustrating the configuration of a camera according to Embodiment 1.

As shown in FIG. 1, a camera 40 includes a solid-state imaging device 1, an optical system 42, a control unit 43, and a signal processing unit 44. The units will be sequentially described below.

The solid-state imaging device 1 generates a signal charge by receiving incident light H incident as a subject image through the optical system 42 at an imaging plane PS and photoelectrically converting the incident light. Here, the solid-state imaging device 1 is driven in accordance with a control signal output from the control unit 43. The solid-state imaging device 1 reads the signal charge and outputs an electrical signal.

The optical system 42 includes optical members such as an imaging lens or an aperture and is disposed to focus the incident light H on the imaging plane PS of the solid-state imaging device 1.

The control unit 43 outputs various control signals to the solid-state imaging device 1 and the signal processing unit 44 and controls the solid-state imaging device 1 and the signal processing unit 44 to operate.

The signal processing unit 44 generates a color digital image by performing a signal process on the electrical signal output from the solid-state imaging device 1.

A-2. Entire Configuration of Solid-State Imaging Device

The entire configuration of the solid-state imaging device 1 will be described below.

Figure 2:
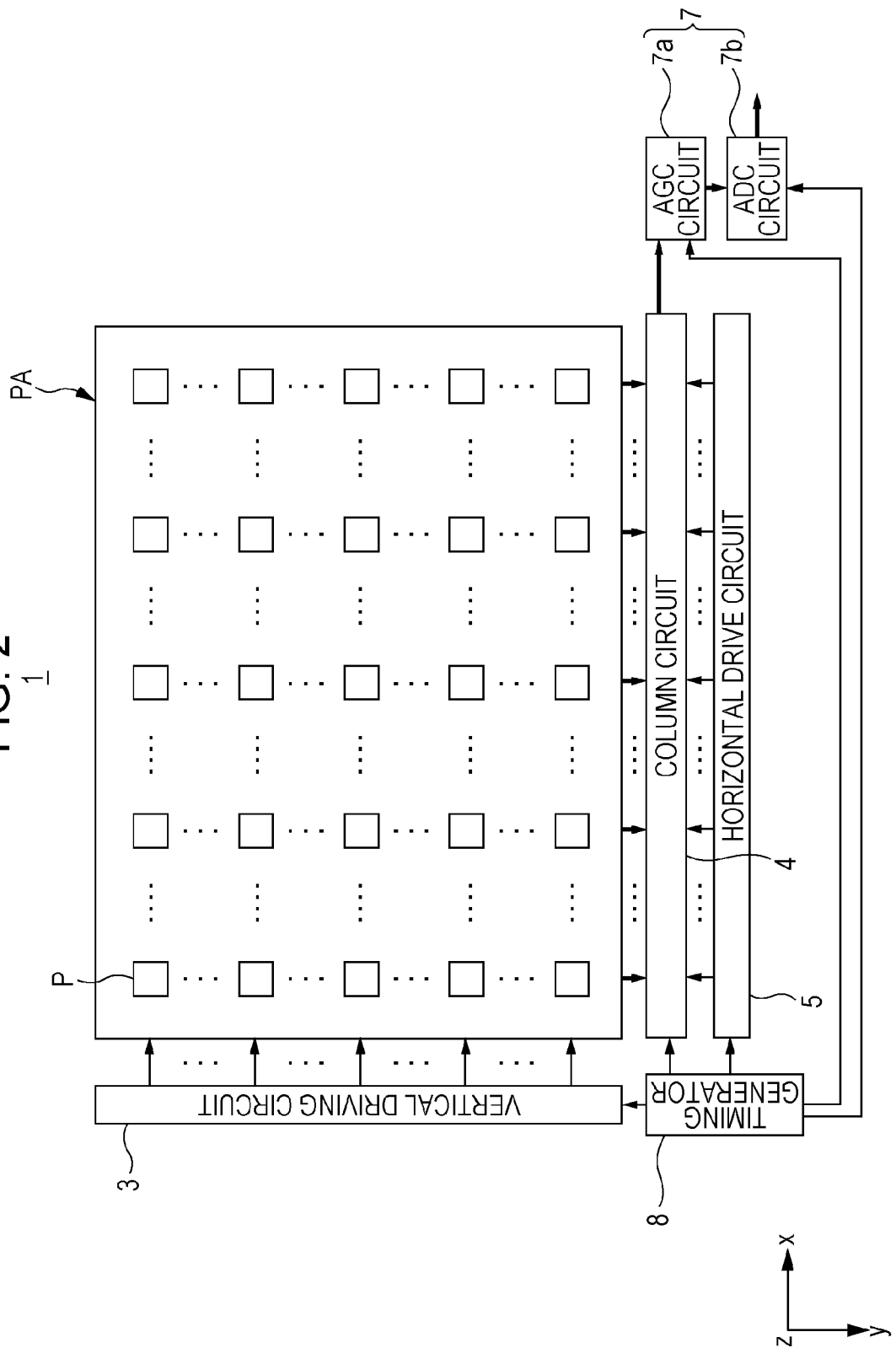
FIG. 2 is a diagram illustrating the entire configuration of a solid-state imaging device according to Embodiment 1.
Figure 3:
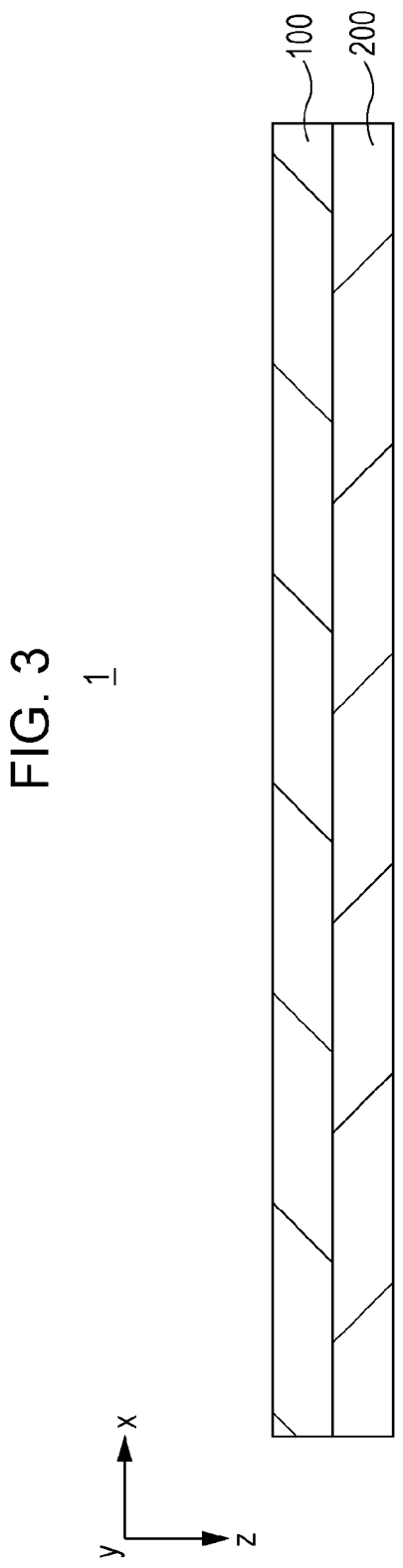
FIG. 3 is a diagram illustrating the entire configuration of the solid-state imaging device according to Embodiment 1.

FIGS. 2 and 3 are diagrams illustrating the entire configuration of the solid-state imaging device according to Embodiment 1.

FIG. 2 is a block diagram and FIG. 3 is a sectional view.

As shown in FIG. 2, the solid-state imaging device 1 includes a pixel area PA.

As shown in FIG. 2, the pixel area PA has a rectangular shape and plural pixels P are arranged in the horizontal direction x and the vertical direction y. That is, the pixels P are arranged in a matrix shape. The pixel area PA corresponds to the imaging plane PS shown in FIG. 1.

As shown in FIG. 2, in the solid-state imaging device 1, a vertical drive circuit 3, a column circuit 4, a horizontal drive circuit 5, an external output circuit 7, and a timing generator 8 are installed as peripheral circuits.

As shown in FIG. 2, the vertical drive circuit 3 is electrically connected to the respective rows of the plural pixels P extending in the horizontal direction x in the pixel area PA.

As shown in FIG. 2, the column circuit 4 is configured to perform a signal process on a signal output from the pixels P in the units of columns. Here, the column circuit 4 includes a CDS (Correlated Double Sampling) circuit (not shown) and performs a signal process of removing fixed pattern noise.

As shown in FIG. 2, the horizontal drive circuit 5 is electrically connected to the column circuit 4. The vertical drive circuit 5 includes, for example, a shift register and sequentially outputs the signals held by the column circuit 4 for each column of the pixels P to the external output circuit 7.

As shown in FIG. 2, the external output circuit 7 is electrically connected to the column circuit 4, performs the signal process on the signals output from the column circuit 4, and outputs the resultant signals to the outside. The external output circuit 7 includes an AGC (Automatic Gain Control) circuit 7a and an ADC circuit 7b. In the external output circuit 7, the AGC circuit 7a applies a gain to the signals and the ADC circuit 7b converts analog signals into digital signals and outputs the digital signals to the outside.

As shown in FIG. 2, the timing generator 8 is electrically connected to the vertical drive circuit 3, the column circuit 4, the horizontal drive circuit 5, and the external output circuit 7. The timing generator 8 generates various pulse signals and outputs the generated pulse signals to the vertical drive circuit 3, the column circuit 4, the horizontal drive circuit 5, and the external output circuit 7, whereby the driving of the units are controlled.

As shown in FIG. 3, the solid-state imaging device 1 includes a sensor substrate 100 and a logic substrate 200 and is a stacked body in which the sensor substrate 100 is stacked on and bonded to the top surface of the logic substrate 200.

The sensor substrate 100 and the logic substrate 200 face each other as shown in FIG. 3, and are bonded to each other at the facing surfaces. In this way, the solid-state imaging device 1 has a "three-dimensional stacked structure" in which the sensor substrate 100 and the logic substrate 200 are stacked. Although details will be described later, the sensor substrate 100 and the logical substrate 200 are electrically connected to each other.

In the solid-state imaging device 1, the pixel area PA shown in FIG. 2 is formed in the sensor substrate 100. The sensor substrate 100 is provided with some of the peripheral circuits shown in FIG. 2. For example, the vertical drive circuit 3 and the timing generator 8 shown in FIG. 2 are disposed around the pixel area PA.

In the solid-state imaging device 1, the logic substrate 200 is provided with the circuits not provided to the sensor substrate 100 out of the peripheral circuits shown in FIG. 2. For example, the column circuit 4, the horizontal drive circuit 5, and the external output circuit 7 shown in FIG. 2 are provided thereto.

All the peripheral circuits shown in FIG. 2 may be provided to the logic substrate 200 without disposing the peripheral circuits around the sensor substrate 100. An interconnection substrate may be disposed instead of the logic substrate 200. That is, plural semiconductor chips having different functions may be stacked to constitute a solid-state imaging device.

A-3. Partial Configuration of Solid-State Imaging Device

The partial configuration of the solid-state imaging device 1 will be described below.

FIGS. 4 to 7 are diagrams illustrating the partial configurations of the solid-state imaging device according to Embodiment 1.

Figure 4:
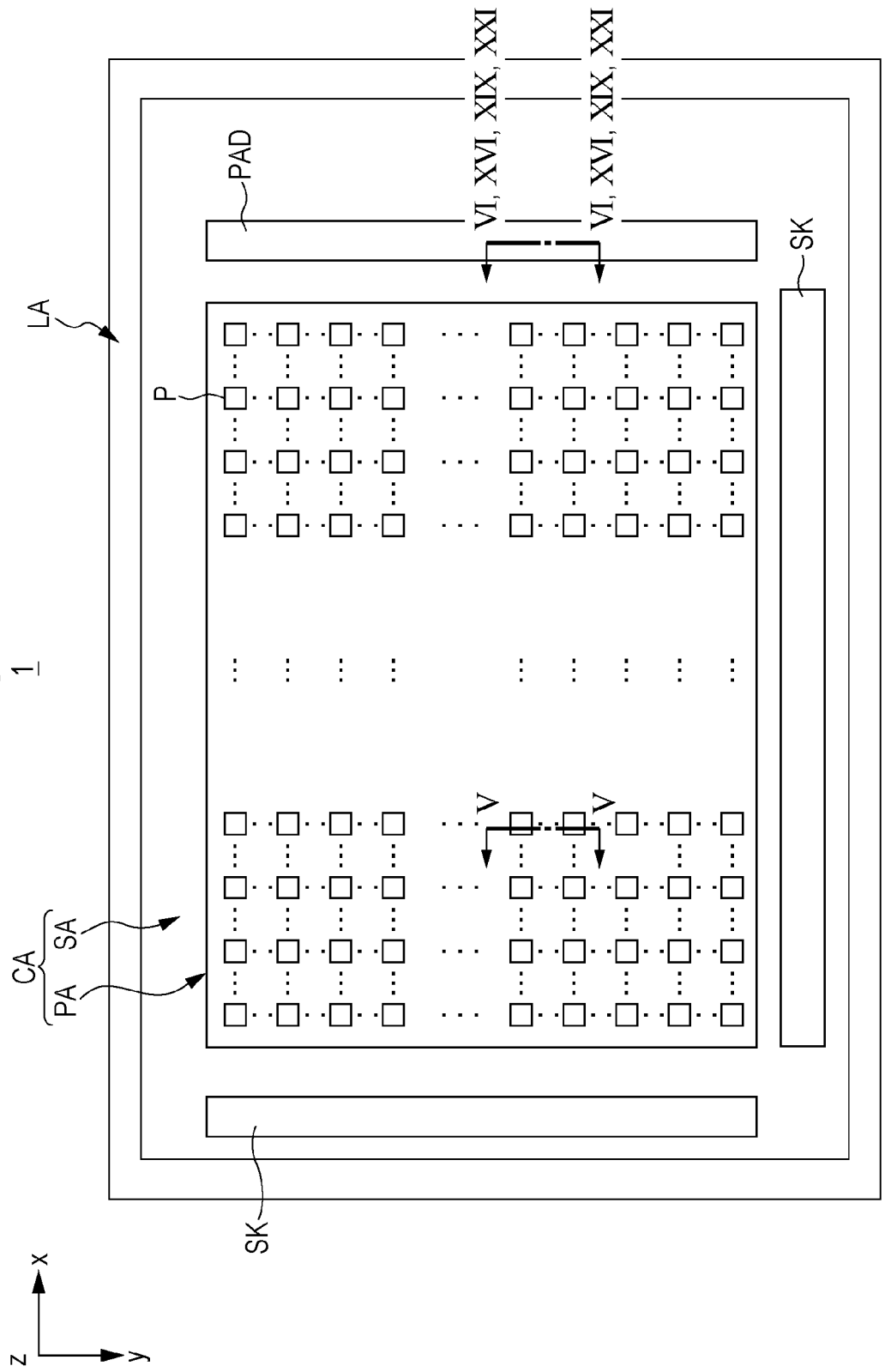
FIG. 4 is a diagram illustrating a partial configuration of the solid-state imaging device according to Embodiment 1.

Here, FIG. 4 is a plan view illustrating the surface of the sensor substrate 100.

Figure 5:
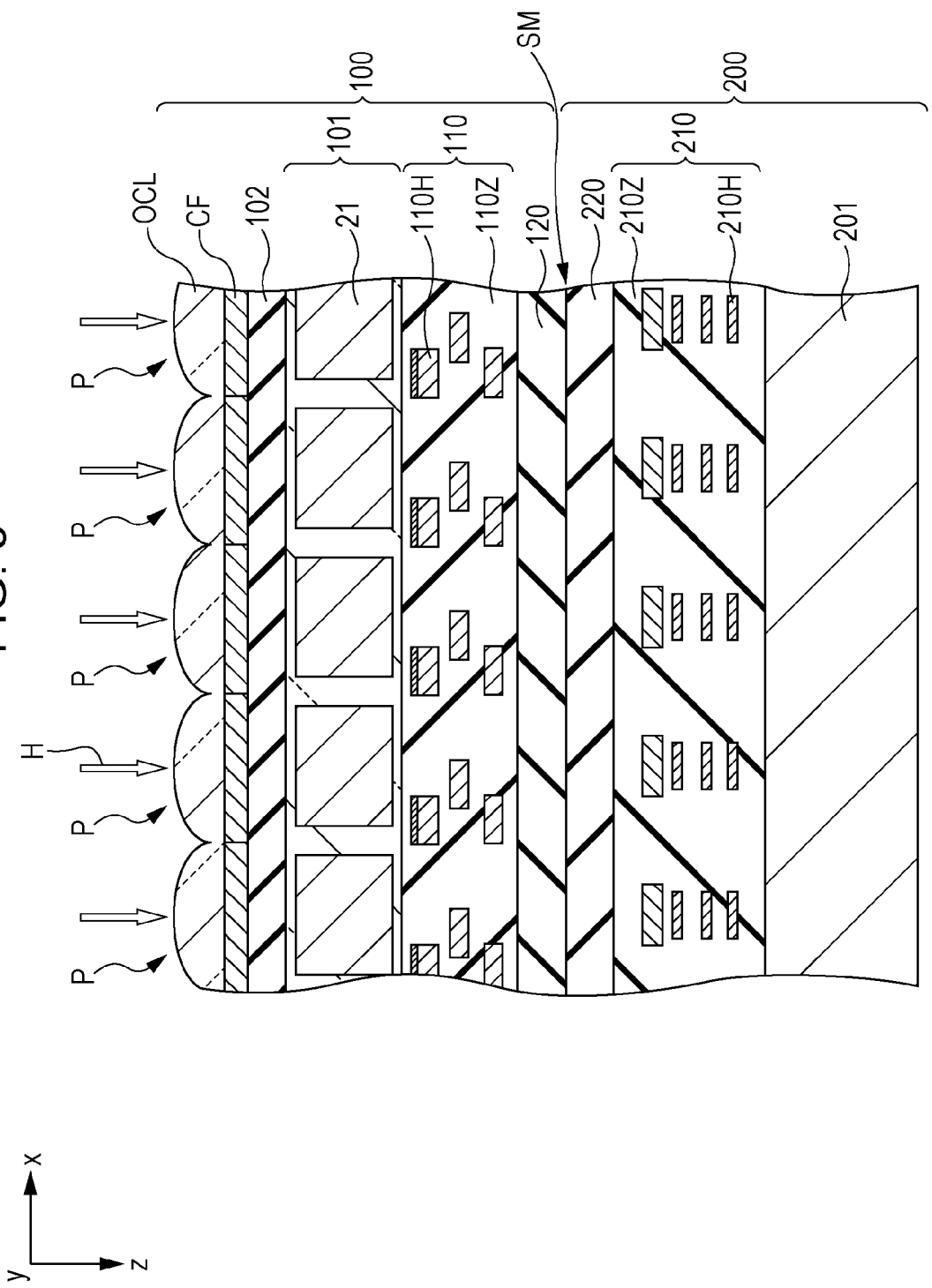
FIG. 5 is a diagram illustrating a partial configuration of the solid-state imaging device according to Embodiment 1.
Figure 6:
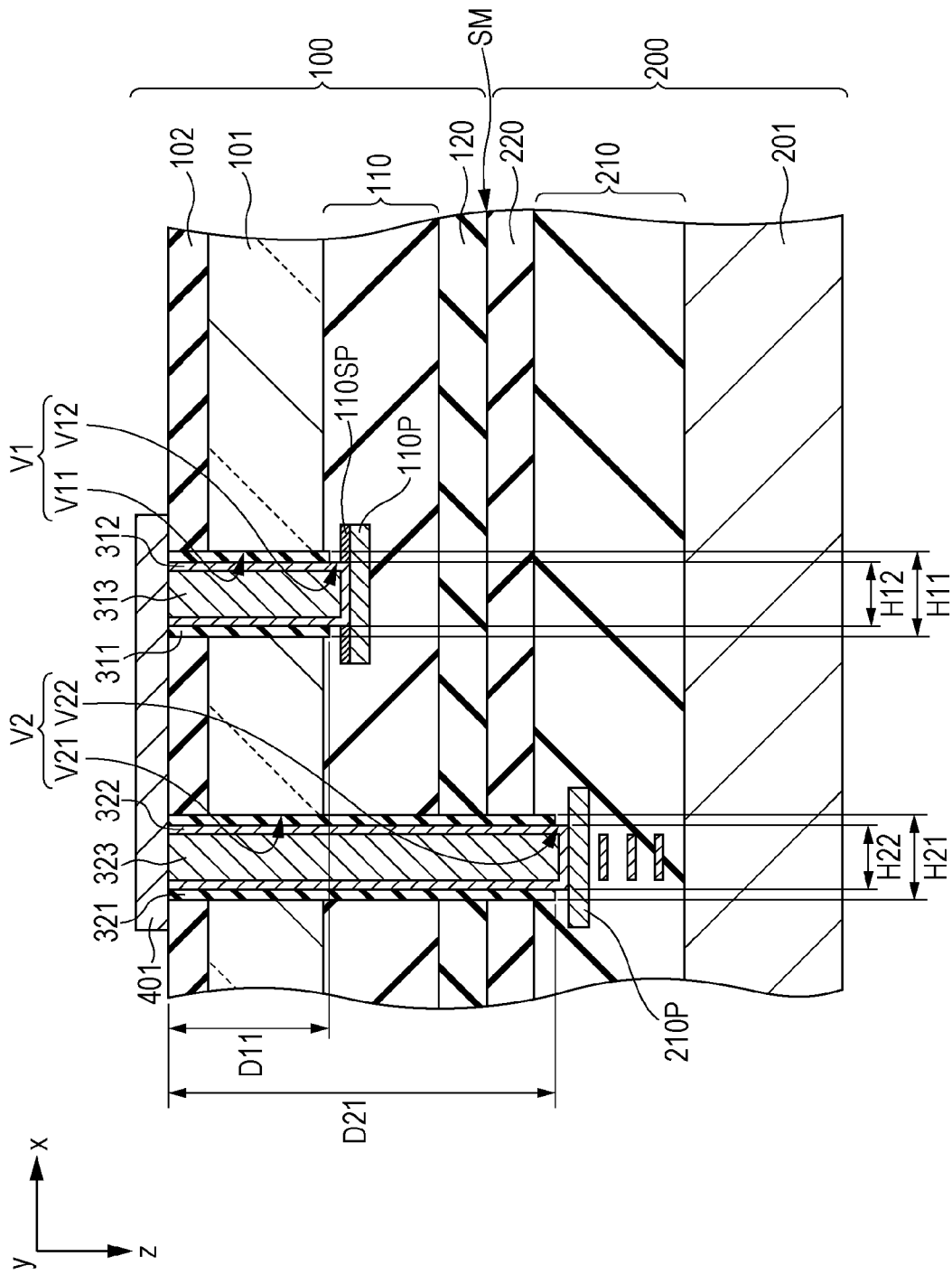
FIG. 6 is a diagram illustrating a partial configuration of the solid-state imaging device according to Embodiment 1.

FIGS. 5 and 6 are sectional views. FIG. 5 shows a section taken along line V-V of FIG. 4. On the other hand, FIG. 6 shows a section taken along line VI-VI of FIG. 4.

Figure 7:
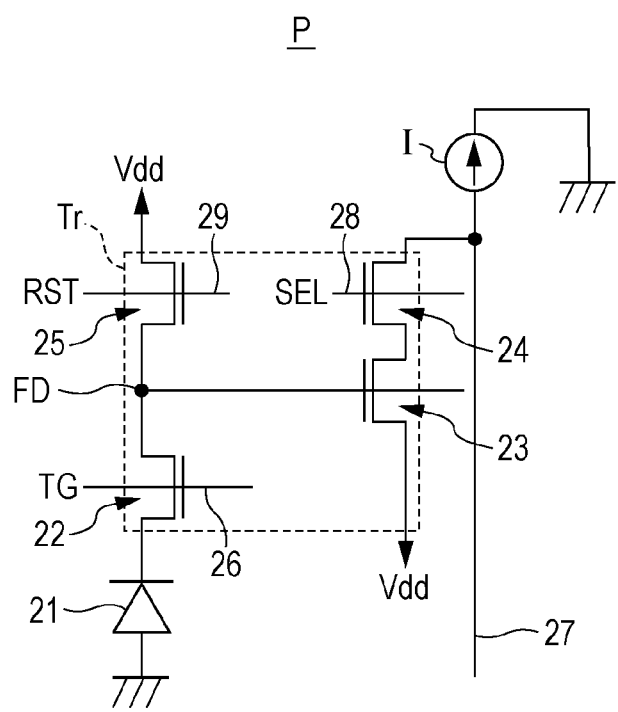
FIG. 7 is a diagram illustrating a partial configuration of the solid-state imaging device according to Embodiment 1.

FIG. 7 shows the circuit configuration of a pixel P.

A-3-1. Surface Configuration

As shown in FIG. 4, a chip area CA and a scribing area LA are disposed on the plane (xy plane) of the solid-state imaging device 1.

The chip area CA has a rectangular shape partitioned in the horizontal direction x and the vertical direction y, as shown in FIG. 4, and includes the pixel area PA (see FIG. 2). The chip area CA also includes the peripheral area SA.

In the chip area CA, the pixel area PA has a rectangular shape as shown in FIG. 4 and plural pixels P are arranged in the horizontal direction x and the vertical direction y.

In the chip area CA, the peripheral area SA is located around the pixel area PA as shown in FIG. 4.

In the peripheral area SA, a pad section PAD and a peripheral circuit section SK are disposed as shown in FIG. 4.

As shown in FIG. 4, the scribing area LA is disposed to surround the chip area CA. Here, the scribing area LA includes parts extending in the horizontal direction x and the vertical direction y and is disposed to drawn a rectangle around the chip area CA.

Plural chip areas CA are arranged in a wafer (not shown) before being diced, and the scribing areas LA extend in line shapes between the plural chip areas CA. A blade comes in contact with the scribing areas LA to perform a dicing process, whereby the wafer is divided into plural solid-state imaging devices 1 each having the chip area CA.

A-3-2. Sectional Configuration

As shown in FIGS. 5 and 6, the solid-state imaging device 1 includes a sensor substrate 100 and a logic substrate 200 which are bonded to each other so as to be stacked facing each other.

The sensor substrate 100 includes a semiconductor substrate 101 as shown in FIGS. 5 and 6. The semiconductor substrate 101 is formed of, for example, monocrystalline silicon.

As shown in FIGS. 5 and 6, in the sensor substrate 100, an interconnection layer 110 and an insulating film 120 are sequentially formed on the surface (bottom surface) of the semiconductor substrate 101 facing the logic substrate 200. The interconnection layer 110 and the insulating film 120 are formed on the entire surface (bottom surface) of the semiconductor substrate 101.

In the sensor substrate 100, as shown in FIG. 5, photodiodes 21 are formed in the pixel area PA inside the semiconductor substrate 101.

In the sensor substrate 100, as shown in FIGS. 5 and 6, an insulating film 102 is formed on the rear surface (top surface) of the semiconductor substrate 101. The insulating film 102 is formed on the entire surface (top surface) of the semiconductor substrate 101.

On the rear surface (top surface) of the semiconductor substrate 101, a color filter CF and an on-chip lens OCL are formed in the pixel area PA with an insulating film 102 interposed therebetween, as shown in FIG. 5.

Although not shown in the drawings, semiconductor circuit elements (not shown) are formed on the bottom surface side of the sensor substrate 100 on which the interconnection layer 110 is formed. Specifically, the semiconductor circuit elements (not shown) are disposed in the pixel area PA so as to constitute a pixel transistor Tr shown in FIG. 7. For example, semiconductor circuit elements (not shown) are disposed in the peripheral area DA so as to constitute the vertical drive circuit 3 and the timing generator 8 shown in FIG. 2.

The logic substrate 200 includes a semiconductor substrate 201 as shown in FIGS. 5 and 6. The semiconductor substrate 201 is formed of, for example, monocrystalline silicon. The semiconductor substrate 201 of the logic substrate 200 faces the semiconductor substrate 101 of the sensor substrate 100. The semiconductor substrate 201 of the logic substrate 200 also serves as a support substrate, thereby guaranteeing the total strength of the solid-state imaging device 1.

In the logic substrate 200, as shown in FIGS. 5 and 6, an interconnection layer 210 and an insulating film 220 are sequentially formed on the surface (top surface) of the semiconductor substrate 201 facing the sensor substrate 100. The interconnection layer 210 and the insulating film 220 are formed on the entire surface (top surface) of the semiconductor substrate 201.

Although not shown in the drawings, semiconductor circuit elements (not shown) such as MOS transistors are formed on the surface (top surface) of the semiconductor substrate 201 in the logic substrate 200. The semiconductor circuit elements (not shown) are configured to constitute, for example, the column circuit 4, the horizontal drive circuit 5, and the external output circuit 7 shown in FIG. 2.

In the solid-state imaging device 1, as shown in FIGS. 5 and 6, the insulating film 120 of the sensor substrate 100 and the insulating film 220 of the logic substrate 200 are bonded to each other at a bonding surface SM. Accordingly, the sensor substrate 100 and the logic substrate 200 are bonded to each other.

In the solid-state imaging device 1, as shown in FIG. 5, incident light H incident from the surface (top surface) of the semiconductor substrate 101 of the sensor substrate 100 opposite to the surface (bottom surface) on which the interconnection layer 110 is formed is received by the use of the photodiodes 21.

That is, the solid-state imaging device 1 is a "backside illumination type CMOS image sensor".

A-3-3. Detailed Configuration

The details of the parts constituting the solid-state imaging device 1 will be sequentially described below.

a. Photodiode

The photodiodes 21 are arranged in the pixel area PA so as to correspond to the pixels P, respectively, as shown in FIG. 5. The photodiodes 21 are formed in the semiconductor substrate 101 of the sensor substrate 100 thinned to, for example, a thickness of 1 to 30 μm.

The photodiodes 21 generates and accumulates signal charges by receiving and photoelectrically converting the incident light H incident as a subject image.

As shown in FIG. 5, color filters CF and micro lenses ML are formed on the rear surface (top surface) of the semiconductor substrate 101 and above the photodiodes 21. Accordingly, the photodiodes 21 receive the incident light H incident sequentially through the parts at a light-receiving surface JS and photoelectrically convert the received light.

The photodiodes 21 includes, for example, an n-type charge accumulating region (not shown) accumulating signal charges (electrons) and the n-type charge accumulating region (not shown) is disposed in a p-type semiconductor region (not shown) of the semiconductor substrate 101. A p-type semiconductor region (not shown) having a high impurity concentration is disposed as a hole accumulating layer in the n-type charge accumulating region and on the surface of the semiconductor substrate 101. That is, each photodiode 21 has an HAD (Hole Accumulation Diode) structure.

As shown in FIG. 7, in each photodiode 21, the anode thereof is grounded and the accumulated signal charges are read by the pixel transistor Tr and are output as an electrical signal to the vertical signal line 27.

b. Pixel Transistor

As described above, the pixel transistors Tr are arranged in the pixel area PA so as to correspond to the pixels P, respectively. As shown in FIG. 7, each pixel transistor Tr includes a transfer transistor 22, an amplification transistor 23, a selection transistor 24, and a reset transistor 25 and outputs the signal charges as an electrical signal from the photodiode 21 of the corresponding pixel P.

As described above, the pixel transistor Tr is not shown in FIG. 5, but the pixel transistor Tr is formed on the surface (bottom surface) of the semiconductor substrate 101. Specifically, in the transistors 22 to 25 constituting each pixel transistor Tr, an active region (not shown) is formed in areas of the semiconductor substrate 101 partitioning the pixels P and the gates thereof are formed of polysilicon including n-type impurities.

In the pixel transistor Tr, the transfer transistor 22 is configured to transfer signal charges generated from the photodiode 21 to a floating diffusion FD, as shown in FIG. 7. Specifically, the transfer transistor 22 is disposed between the cathode of the photodiode 21 and the floating diffusion FD. A transfer line 26 is electrically connected to the gate of the transfer transistor 22. The transfer transistor 22 transfers the signal charges accumulated in the photodiode 21 to the floating diffusion FD on the basis of a transfer signal TG transmitted to the gate from the transfer line 26.

In the pixel transistor Tr, the amplification transistor 23 is configured to amplify and output the electrical signal converted from charges into a voltage in the floating diffusion FD, as shown in FIG. 7. Specifically, the gate of the amplification transistor 23 is electrically connected to the floating diffusion FD. The drain of the amplification transistor 23 is electrically connected to a power supply line Vdd and the source thereof is electrically connected to the selection transistor 24. When the selection transistor 24 is selected into the ON state, the amplification transistor 23 is supplied with constant current from a constant current source I and operates as a source follower. Accordingly, the amplification transistor 23 amplifies the electrical signal converted from charges to the voltage in the floating diffusion FD, by supplying a selection signal to the selection transistor 24.

In the pixel transistor Tr, the selection transistor 24 is configured to output an electrical signal output from the amplification transistor 23 to the vertical signal line 27 in response to a selection signal, as shown in FIG. 7. Specifically, the gate of the selection transistor 24 is connected to an address line 28 through the selection signal is supplied. When the selection signal is supplied, the selection transistor 24 is turned on to output the output signal amplified by the amplification transistor 23 to the vertical signal line 27, as described above.

In the pixel transistor Tr, the reset transistor 25 is configured to reset the potential of the amplification transistor 23, as shown in FIG. 7. Specifically, the gate of the reset transistor 25 is electrically connected to a reset line 29 through which a reset signal is supplied. The drain of the reset transistor 25 is electrically connected to a power supply line Vdd and the source is electrically connected to the floating diffusion FD. The reset transistor 25 resets the gate potential of the amplification transistor 23 to a source voltage through the floating diffusion FD in response to the reset signal supplied from the reset line 29.

The gates of the transistors 22, 24, and 25 are connected in the units of rows each including plural pixels P arranged in the horizontal direction x and are simultaneously driven for each row including the plural pixels. Specifically, the pixels are sequentially selected in the units of horizontal lines (pixel rows) in the vertical direction in response to the selection signal supplied from the vertical drive circuit (not shown). The transistors of each pixel P are controlled by the use of timing signals output from the timing generator (not shown). Accordingly, the output signals of the pixels P are read to the column circuit (not shown) through the vertical signal lines 27 for each column of the pixels P. The signals held by the column circuit are selected by the horizontal drive circuit (not shown) and are sequentially output to the external output circuit (not shown).

c. Color Filter

The color filter CF is formed on the rear surface (top surface) of the semiconductor substrate 101 in the pixel area PA, as shown in FIG. 5.

Here, the insulating film 102 is formed on the rear surface (top surface) of the semiconductor substrate 101. The insulating film 102 is formed of an insulating material such as SiN. The color filter CF is formed on the top surface of the insulating film 102.

The color filter CF colors the incident light H incident through the on-chip lens OCL form the rear surface (top surface) of the semiconductor substrate 101 and transmits the colored incident light. For example, the color filter CF selectively transmits light of a predetermined wavelength range out of visible rays incident as the incident light H.

The color filter CF includes, for example, a red filter layer (not shown), a green filter side (not shown), and a blue filter layer (not shown) and filter layers of three primary colors are arranged in a Bayer array to correspond to the pixels P, respectively.

For example, the color filter CF is formed by applying a coating liquid including a coloring pigment and a photo resist resin through the use of a coating method such as a spin coating method to form a coating film and patterning the coating film through the use of a lithography technique.

d. On-Chip Lens

The on-chip lenses OCL are arranged in the pixel area PA to correspond to the pixels P, respectively, as shown in FIG. 5.

The on-chip lenses OCL are formed on the surface of the color filter CF on the rear surface (top surface) side of the semiconductor substrate 101.

The on-chip lenses OCL are convex lenses protruding upward from the rear surface (top surface) of the semiconductor substrate 101 and focuses the incident light H incident from the rear surface (top surface) side of the semiconductor substrate 101 on the photodiodes 21.

The on-chip lenses OCL are formed by processing a lens material layer (not shown) formed on the top surface of the insulating film 102 with the color filter CF interposed therebetween. For example, by forming an organic resin material layer on the top surface of the insulating film 102, the lens material layer (not shown) is formed. Then, a photo resist film (not shown) is formed on the lens material layer (not shown) and then the photo resist film (not shown) is patterned in lens shapes. An etch-back process is performed on the lens material layer (not shown) using the lens-like resist pattern (not shown) as a mask. In this way, the on-chip lenses OCL are formed. Alternatively, by patterning the lens material layer (not shown) and then performing a reflowing process, the on-chip lenses OCL may be formed.

e. Interconnection Layer and Insulating Film of Sensor Substrate

In the sensor substrate 100, the interconnection layer 110 is formed on the surface (bottom surface) of the semiconductor substrate 101 opposite to the rear surface (top surface) on which various members such as the color filter CF and the micro lenses ML are formed, as shown in FIGS. 5 and 6. That is, in the sensor substrate 100, the interconnection layer 110 is formed on the surface (bottom surface) of the semiconductor substrate 101 facing the logic substrate 200.

As shown in FIG. 5, the interconnection layer 110 includes an interconnection 110H and an insulating film 1102 and the interconnection 110H is formed in the insulating film 1102. The interconnection layer 110 is a so-called multi-layered interconnection layer, and an interlayer insulating film constituting the insulating film 1102 and the interconnection 110H are alternately stacked plural times.

The insulating film 1102 is formed of an insulating material. The interconnection 110H is formed of a conductive metal material.

In the interconnection layer 110, the interconnections 110H are stacked in plural layers to serve as various interconnections such as the transfer line 26, the address line 28, the vertical signal line 27, and the reset line 29 shown in FIG. 7.

As shown in FIGS. 5 and 6, the insulating film 120 is formed on the surface (bottom surface) of the interconnection layer 110 opposite to the semiconductor substrate 101.

f. Interconnection Layer and Insulating Film of Logic Substrate

In the logic substrate 200, the interconnection layer 210 is formed on the surface (top surface) of the semiconductor substrate 201 opposite to the sensor substrate 100, as shown in FIGS. 5 and 6.

As shown in FIG. 5, the interconnection layer 210 includes an interconnection 210H and an insulating film 210Z and the interconnection 210H is formed in the insulating film 210Z. The interconnection layer 210 is a so-called multi-layered interconnection layer, and an interlayer insulating film constituting the insulating film 210Z and the interconnection 210H are alternately stacked in plural times.

The insulating film 210Z is formed of an insulating material. The interconnection 210H is formed of a conductive metal material.

In the interconnection layer 210, the interconnections 210H are stacked in plural layers to serve as an interconnection electrically connected to semiconductor circuit elements (not shown) formed in the semiconductor substrate 201 of the logic substrate 200.

As shown in FIGS. 5 and 6, the insulating film 220 is formed on the surface (top surface) of the interconnection layer 210 opposite to the semiconductor substrate 201.

g. Pad Section

As shown in FIG. 4, the pad section PAD is disposed in the peripheral area SA. As shown in FIG. 6, pad interconnections 110P and 210P, pad openings V1 and V2, and a conductive connection layer 401 are formed in the pad section PAD. The elements formed in the pad section PAD will be sequentially described.

g-1. Pad Interconnection of Sensor Substrate

In the pad section PAD, the pad interconnection 110P is formed in the sensor substrate 100, as shown in FIG. 6.

The pad interconnection 110P formed in the pad section PAD of the sensor substrate 100 is formed inside the interconnection layer 110, as shown in FIG. 6, similarly to the other interconnection 110H. The pad interconnection 110P of the sensor substrate 100 is formed above the pad interconnection 210P formed in the logic substrate 200 in the stacked body of the sensor substrate 100 and the logic substrate 200.

The pad interconnection 110P formed in the pad section PAD is electrically connected to the other interconnections 110H and electrically connects semiconductor circuit elements (not shown) formed in the sensor substrate 100 and elements (not shown) formed in the outside. Here, in the pad section PAD, the pad interconnection 110P of the sensor substrate 100 is electrically connected to the other pad interconnection 210P formed in the interconnection layer 210 of the logical substrate 200.

g-2. Pad Opening

As shown in FIG. 6, the pad opening V1 is formed above the pad interconnection 110P formed in the sensor substrate 100 in the pad section PAD. The pad opening V1 is formed to penetrate the semiconductor substrate 101 constituting the sensor substrate 100. Although not shown in the drawing, the pad opening V1 has, for example, a circular surface shape.

Here, the pad interconnection 110P has an etching stopper layer 110SP formed on the surface thereof, and the pad opening V1 is formed to pass from the top surface of the etching stopper layer 110SP to the top surface of the insulating film 102.

Although details will be described later, the etching stopper layer 110SP serves to stop an etching process when removing the members formed thereon through the use of the etching process. That is, the etching stopper layer 110SP is formed of a material having an etching rate lower than that of the members formed thereon. In this embodiment, the etching stopper layer 110SP is formed of a material having an etching rate lower than that of the pad interconnection 110P in the etching process of simultaneously removing parts formed on the pad interconnections 110P and 210P. In order to prevent the pad interconnection 110P from being damaged due to the etching process, the etching stopper layer 110SP is formed of a material having an etching rate lower than that of the pad interconnection 110P.

As shown in FIG. 6, the pad opening V1 includes an upper opening V11 and a lower opening V12, and the upper opening V11 and the lower opening V12 are formed to overlap with each other in the depth direction z.

As shown in FIG. 6, the upper opening V11 passes from the top of the interconnection layer 110 in the sensor substrate 100 to the top surface of the insulating film 102. That is, the upper opening V11 penetrates the semiconductor substrate 101 and the insulating film 102 of the sensor substrate 100.

As shown in FIG. 6, the lower opening V12 is formed to expose the surface of the pad interconnection 110P. That is, the lower opening V12 penetrates the part formed on the pad interconnection 110P in the interconnection layer 110 of the sensor substrate 100.

An insulating film 311, a barrier metal layer 312, and a metal layer 313 are formed in the pad opening V1.

Here, the insulating film 311 is formed to coat the side surface of the upper opening V11 of the pad opening V1.

The barrier metal layer 312 is formed to coat the side surface of the upper opening V11 with the insulating film 311 interposed therebetween. The barrier metal layer 312 coats the bottom surface of the lower opening V12 in addition to the side surface thereof.

The metal layer 313 is formed to fill the insides of the upper opening V11 and the lower opening V12 with the insulating film 311 and the barrier metal layer 312 interposed therebetween.

g-3. Pad Interconnection of Logic Substrate

In the pad section PAD, as shown in FIG. 6, the pad interconnection 210P is formed in the logic substrate 200.

In the pad section PAD, the pad interconnection 210P formed in the logic substrate 200 is formed in the insulating film 210Z, similarly to the other interconnections 210H constituting the interconnection layer 210, as shown in FIG. 6.

The pad interconnection 210P is electrically connected to the other interconnections 210H and electrically connects semiconductor circuit elements (not shown) formed in the logic substrate 200 and elements (not shown) formed in the outside to each other. Here, the pad interconnection 210P is electrically connected to the other pad interconnection 110P formed in the interconnection layer 110 of the sensor substrate 100.

g-4. Pad Opening

As shown in FIG. 6, in the pad section PAD, the pad opening V2 is formed above the pad interconnection 210P formed in the logic substrate 200. The pad opening V2 penetrates the semiconductor substrate 101 constituting the sensor substrate 100. Although not shown in the drawing, the pad opening V2 has, for example, a circular surface shape.

Although details will be described later, the pad opening V2 is formed through the same process as forming the pad opening V1 located above the pad interconnection 110P of the sensor substrate 100. That is, the pad opening V2 is formed by removing the parts formed on the pad interconnection 210P through the use of an etching process, similarly to the pad opening V1.

As shown in FIG. 6, the pad opening V2 includes an upper opening V21 and a lower opening V22, and the upper opening V21 and the lower opening V22 are formed to overlap with each other in the depth direction z.

As shown in FIG. 6, the upper opening V21 passes from the top of the interconnection layer 210 in the logic substrate 200 to the top surface of the insulating film 102. That is, in the stacked body of the sensor substrate 100 and the logic substrate 200, the upper opening V21 penetrates the part formed on the pad interconnection 210P in the interconnection layer 210 of the logic substrate 200.

The upper opening V21 of the pad opening V2 has the same planar shape as the upper opening V11 of the other pad opening V1, except that it is deeper than the upper opening V11. That is, the width H21 of the upper opening V21 is equal to the width H11 of the upper opening V11.

As shown in FIG. 6, the lower opening V22 is formed to expose the top surface of the pad interconnection 210P in the logic substrate 200. That is, in the stacked body of the sensor substrate 100 and the logic substrate 200, the lower opening V22 penetrates the upper part of the interconnection layer 210 of the logical substrate 200.

The lower opening V22 of the pad opening V2 has the same planar shape as the lower opening V12 of the other pad opening V1, except that it is deeper than the lower opening V12. That is, the width H22 of the lower opening V22 is equal to the width H12 of the lower opening V12.

The insulating film 321, the barrier metal layer 322, and the metal layer 323 are formed inside the pad opening V2.

Here, the insulating film 321 is formed to coat the side surface of the upper opening V21 of the pad opening V2.

The barrier metal layer 322 is formed to coat the side surface of the upper opening V21 with the insulating film 321 interposed therebetween. The barrier metal layer 322 coats the bottom surface of the lower opening V22 in addition to the side surface thereof.

The metal layer 323 is formed to fill the insides of the upper opening V21 and the lower opening V22 with the insulating film 321 and the barrier metal layer 322 interposed therebetween.

g-5. Conductive Connection Layer

In addition, the conductive connection layer 401 is formed in the pad section PAD, as shown in FIG. 6. The conductive connection layer 401 is formed on the top surface of the insulating film 102.

The conductive connection layer 401 is formed of a conductive metal material so as to electrically connect the pad interconnection 110P formed in the sensor substrate 100 and the pad interconnection 210P formed in the logic substrate 200 to each other in the pad section PAD. Here, the conductive connection layer 401 electrically connects the pad interconnections 110P and 210P through the barrier metal layers 312 and 322 and the metal layers 313 and 323 formed in the pad openings V1 and V2.

B. Manufacturing Method

A part of the method of manufacturing the solid-state imaging device 1 will be described.

FIGS. 8 to 15 are diagrams illustrating a part of the method of manufacturing a solid-state imaging device according to Example 1.

FIG. 8 is a flowchart illustrating the flow of the manufacturing method.

FIGS. 9A to 15 are sectional views illustrating the same section as shown in FIG. 6 and show the pad section PAD. Although not shown, various elements are formed in the same section as shown in FIG. 5 in the same way as shown in FIGS. 9 to 15.

In this embodiment, the processes of steps ST10 to ST60 shown in FIG. 8 are performed as shown in FIGS. 9A to 15.

Thereafter, by performing a dicing process on the scribing areas LA by the use of a blade (not shown), the solid-state imaging device 1 is manufactured.

The process steps of manufacturing the solid-state imaging device 1 will be sequentially described below.

B-1. Formation of Sensor Substrate

First, as shown in FIG. 8, the sensor substrate 100 is formed (ST10).

In this step, as shown in FIGS. 9A to 9C, the sensor substrate 100 is formed by forming various elements such as the interconnection layer 110 and the insulating film 120. In this step, the insulating film 102, the color filter CF, the on-chip lenses OCL, and the conductive connection layer 401 are not formed on the rear surface (the top surface in FIGS. 9A to 9C and the bottom surface in FIGS. 5 and 6) of the semiconductor substrate 101 constituting the sensor substrate 100.

In this step, the photodiodes 21 are formed in the pixel area PA of the semiconductor substrate 101 (see FIG. 5) before the process steps shown in FIGS. 9A to 9C. Semiconductor circuit elements (not shown) such as the pixel transistor Tr (see FIG. 7) are formed on the surface (the top surface in FIGS. 9A to 9C) of the semiconductor substrate 101.

As shown in FIGS. 9A to 9C, the interconnection layer 110 is formed to coat the entire surface (top surface) of the semiconductor substrate 101. The insulating film 120 is formed on the entire surface (top surface) of the semiconductor substrate 101 with the interconnection layer 110 interposed therebetween.

Specifically, as shown in FIG. 9A, the insulating film 110Za constituting the interconnection layer 110 is formed on the entire surface (top surface) of the semiconductor substrate 101. The etching stopper material layer 510SP is formed to coat the entire surface (top surface) of the semiconductor substrate 101 with the insulating film 110Za interposed therebetween.

For example, the etching stopper material layer 510SP is formed under the following conditions.

Forming Conditions of Etching Stopper Material Layer 510SP material: P—SiN, P—SiON, P—SiCN, or the like
    thickness: 70 to 200 nm
    forming method: plasma CVD method
    gas flow ratio: $SiH_4:NH_3:N_2=1:1:20$
    source power: 50 to 1000 W
    pressure: 1 to 10 Torr
    forming temperature: 300° C. to 400° C. for 30 seconds to 2 minutes Thereafter, the interconnection material layer 510P is formed to coat the entire surface (top surface) of the semiconductor substrate 101 with the insulating film 110Za and the etching stopper material layer 510SP.

For example, the interconnection material layer 510P is formed of Al. For example, the interconnection material layer 510P is formed with a thickness of 100 nm to 1 μm. The interconnection material layer 510P may be formed of a conductive material such as W or Ti.

As shown in FIG. 9B, the etching stopper layer 110SP and the pad interconnection 110P are formed.

Here, the pad interconnection 110P is formed by patterning the interconnection material layer 510P. When the pad interconnection 110P is formed in the pad section PAD, the first-layer interconnection 110H closest to the semiconductor substrate 101 in the interconnection layer 110 formed in the pixel area PA is formed by patterning the interconnection material layer 510P, as shown in FIG. 5.

The etching stopper layer 110SP is formed by patterning the etching stopper material layer 510SP. As shown in FIG. 5, this patterning process is similarly performed on the pixel area PA.

Specifically, the patterning process is performed by forming a photo resist pattern (not shown) through a photolithography technique and then performing a dry etching process using the photo resist pattern (not shown) as a mask.

As shown in FIG. 9C, the insulating film 120 is formed after the interconnection layer 110 is completely formed.

Here, a second-layer insulating film (not shown) is formed to coat the first-layer insulating film 110Za and then a second-layer interconnection 110H (see FIG. 5) is formed. A third-layer insulating film (not shown) is formed and then a third-layer interconnection 110H (see FIG. 5) is formed. Then, a fourth-layer insulating film (not shown) is formed thereon. In this way, by alternately forming plural insulating films (110Za and the like) and plural interconnections 110H (see FIG. 5), the interconnection layer 110 is formed.

Thereafter, the insulating film 120 is formed to coat the entire surface (the top surface in FIGS. 9A to 9C and the bottom surface in FIG. 5) of the interconnection layer 110. For example, a silicon oxide film is formed as the insulating film 120. Otherwise, a silicon nitride film may be formed as the insulating film 120.

B-2. Formation of Logic Substrate

As shown in FIG. 8, the logic substrate 200 is formed (ST20).

Figure 10:
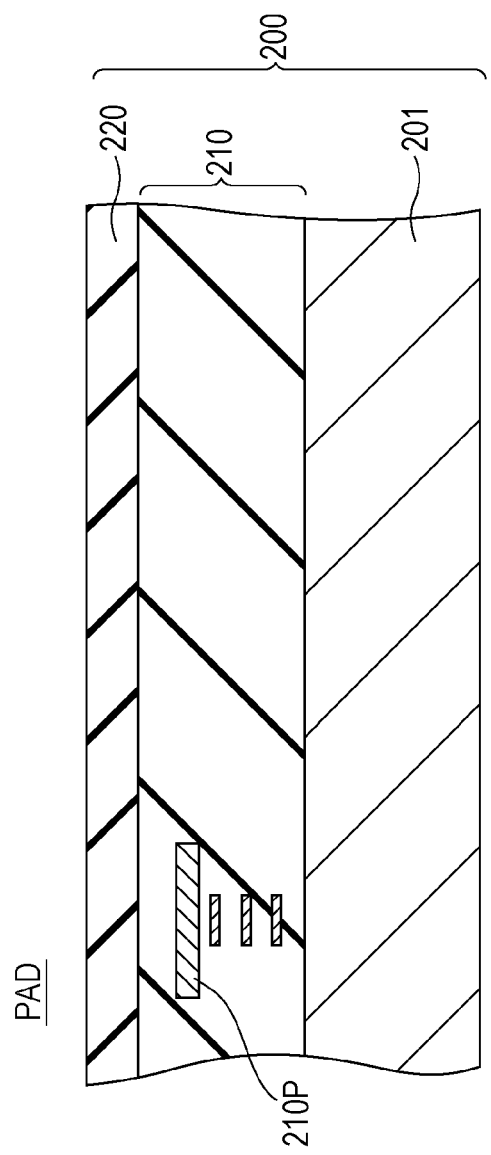
FIG. 10 is a diagram illustrating a part of the method of manufacturing the solid-state imaging device according to Embodiment 1.

Here, as shown in FIG. 10, the logic substrate 200 is formed by sequentially forming the interconnection layer 210 and the insulating film 220 on the surface (top surface) of the semiconductor substrate 201.

In this step, semiconductor circuit elements (not shown) are formed on the surface (top surface) of the semiconductor substrate 201 before the process shown in FIG. 10.

As shown in FIG. 10, the interconnection layer 210 is formed to coat the entire surface (top surface) of the semiconductor substrate 201 in which the semiconductor circuit elements (not shown) are formed.

The interconnection layer 210 is formed by alternately forming plural insulating films (not shown) and plural interconnections 210H (see FIG. 5). When forming the interconnections 210H, the pad interconnection 210P formed in the pad section PAD is formed through the same process, as shown in FIG. 10.

Thereafter, the insulating film 220 is formed to coat the entire surface (top surface) of the interconnection layer 210. For example, a silicon oxide film is formed as the insulating film 220. Otherwise, a silicon nitride film may be formed as the insulating film 220.

B-3. Bonding of Sensor Substrate and Logic Substrate

As shown in FIG. 8, the sensor substrate 100 and the logic substrate 200 are bonded to each other (ST30).

Here, as shown in FIG. 11, both are bonded to each other by facing and bonding the insulating film 120 of the sensor substrate 100 and the insulating film 220 of the logic substrate 200 to each other.

For example, this bonding process is performed through the use of plasma bonding.

B-4. Thinning of Sensor Substrate

As shown in FIG. 8, the sensor substrate 100 is thinned (ST40).

As shown in FIG. 12, for example, a CMP process is performed on the surface (top surface) of the semiconductor substrate 101 constituting the sensor substrate 100 opposite to the surface (bottom surface) facing the logic substrate 200, thereby thinning the sensor substrate 100.

B-5. Formation of Pad Opening

As shown in FIG. 8, the pad openings V1 and V2 are then formed (ST50).

Here, the pad openings V1 and V2 are formed by sequentially performing the process steps shown in FIGS. 13 to 15.

In the process steps, first, the insulating film 102 is formed on the rear surface (top surface) of the semiconductor substrate 101 constituting the sensor substrate 100, as shown in FIG. 13. For example, a silicon oxide film is formed as the insulating film 102.

Then, as shown in FIG. 13, the upper openings V11 and V21 constituting the pad openings V1 and V2 (see FIG. 6).

As shown in FIG. 13, the upper opening V11 constituting the pad opening V1 (see FIG. 6) is formed above the pad interconnection 110P formed in the sensor substrate 100 in the pad section PAD. The upper opening V11 is formed to pass from the top of the etching stopper layer 110SP to the top surface of the insulating film 102 in the sensor substrate 100. That is, the upper opening V11 is formed by removing the part located higher than the position where the surface of the etching stopper layer 110SP is not exposed above the pad interconnection 110P in the sensor substrate 100. In this way, the upper opening V11 is formed to open the part just before the pad interconnection 110P formed in the sensor substrate 100.

As shown in FIG. 13, the upper opening V21 constituting the pad opening V2 (see FIG. 6) is formed above the pad interconnection 210P formed in the logic substrate 200 in the pad section PAD. The upper opening V21 is formed to pass from the top of the pad interconnection 210P formed in the logic substrate 200 to the top surface of the insulating film 102. That is, the upper opening V21 is formed by removing the part located higher than the position where the surface of the pad interconnection 210P is not exposed in the sensor substrate 100 and the logic substrate 200. In this way, the upper opening V21 is formed to open the part just before the pad interconnection 210P formed in the logic substrate 200.

For example, the upper openings V11 and V21 are formed to satisfy the following conditions.

Upper Opening V11
  depth D11: 200 nm to 5 μm
  width H11: 1 to 5 μm
  thickness of the insulating film remaining on the top of the etching stopper layer 110SP: 0 to 500 nm
(The insulating film may not be left or may be intentionally by a time etching process. When a film of SiN or the like is formed in the middle way, the etching conditions may be established so that the etching is stopped at the film.)

Upper Opening V21
  depth D21: 5 to 50 μm
  width H21: 1 to 5 μm
  thickness of the insulating film remaining on the top of the pad interconnection 210P: 100 to 500 nm
(The insulating film may not be left or may be intentionally by a time etching process. When a film of SiN or the like is formed in the middle way, the etching conditions may be established so that the etching is stopped at the film.)

As shown in FIG. 14, the insulating film 310 is formed to coat the surface (top surface) of the sensor substrate 100 opposite to the surface (bottom surface) facing the logic substrate 200.

As shown in FIG. 14, the insulating film 310 is formed to coat the side surfaces and the bottom surfaces of the upper openings V11 and V21 formed on the surface of the sensor substrate 100.

For example, the insulating film 310 is formed under the following conditions.

Forming Conditions of Insulating Film
material: insulating oxide film of P—$SiO_2$ or stacked body of P-Sin and $SiO_2$ or P—SiON
thickness: 200 nm to 2 μm
forming method: plasma CVD method (for example, a ratio of $SiH_4/N_2O/N_2$ of 1:4:5, a pressure of 0.5 to 7 Torr, RF power of 200 to 700 W, a temperature of 300° C. to 400° C., and a process time of 30 seconds to 5 minutes)

Then, as shown in FIG. 15, the lower openings V12 and V22 constituting the pad openings V1 and V2 (see FIG. 6) are formed.

Here, as shown in FIG. 15, the lower opening V12 constituting the pad opening V1 is formed above the pad interconnection 110P formed in the sensor substrate 100. The lower opening V12 is formed to expose the surface of the etching stopper layer 110SP. That is, the lower opening V12 is formed to penetrate the part formed on the etching stopper layer 110SP in the interconnection layer 110 of the sensor substrate 100.

At the same time, as shown in FIG. 15, the lower opening V22 constituting the pad opening V2 is formed above the pad interconnection 210P formed in the logic substrate 200. The lower opening V22 is formed to expose the surface of the pad interconnection 210P in the logic substrate 200. That is, the lower opening V22 is formed to penetrate the upper part of the interconnection layer 210 of the logic substrate 200 in the stacked body of the sensor substrate 100 and the logic substrate 200.

For example, by performing an etch-back process to simultaneously remove the parts formed on the pad interconnections 110P and 210P, the lower openings V12 and V22 are formed as shown in FIG. 15. At this time, this etching process is performed to remove the middle part of the etching stopper layer 110SP on the pad interconnection 110P.

Conditions of Etch-Back Process (when the Etching Stopper Layer 110SP is Formed of P—SiN, P—SiON, or P—SiCN)
temperature: normal temperature
pressure: 30 to 100 mTorr
source power: 500 to 2500 W
gas flow ratio: $C_5F_8/Ar/O_2$=6/1/1
substrate bias: 700 to 2000 W for 30 seconds to 2 minutes
selectivity ratio of the underlying etching stopper layer: 10

Accordingly, as shown in FIG. 15, the insulating film 311 coats the side surface of the upper opening V11 above the pad interconnection 110P of the sensor substrate 100. In addition, the insulating film 321 coats the side surface of the upper opening V21 above the pad interconnection 210P of the logic substrate 200.

Thereafter, although not shown in FIG. 15, the etching stopper layer 110SP remaining on the surface of the pad interconnection 110P is removed from the part in which the lower opening V12 is formed. Accordingly, the surface of the pad interconnection 110P is exposed to complete the lower opening V12. For example, a photo resist pattern (not shown) is formed to open the top part of the etching stopper layer 110SP remaining in the part in which the lower opening V12 and to coat the other part. By performing the etching process with the photo resist pattern (not shown) as a mask, the etching stopper layer 110SP is removed from the surface of the pad interconnection 110P.

In this way, the pad openings V1 and V2 are formed to penetrate the semiconductor substrate 101 constituting the sensor substrate 100.

B-6. Connection of Sensor Substrate and Logic Substrate

Then, as shown in FIG. 8, the sensor substrate 100 and the logic substrate 200 are connected to each other (ST60).

Here, as shown in FIG. 6, the sensor substrate 100 and the logic substrate 200 are electrically connected to each other.

Specifically, as shown in FIG. 6, the barrier metal layer 312 is formed to coat the side surface of the upper opening V11 and the side surface and the lower surface of the lower opening V12 with the insulating film 311 interposed therebetween. At the same time, the barrier metal layer 322 is formed to coat the side surface of the upper opening V21 and the side surface and the bottom surface of the lower opening V22 with the insulating film 321 interposed therebetween.

For example, the barrier metal layers 312 and 322 are formed under the following conditions.

Forming Conditions of Barrier Metal Layers
material: Ta or a stacked body of Ta and TaN
thickness: 10 to 200 nm
forming method: sputtering method As shown in FIG. 6, the metal layer 313 is formed to fill the insides of the upper opening V11 and the lower opening V12 with the insulating film 311 and the barrier metal layer 312 interposed therebetween. At the same time, the metal layer 323 is formed to fill the insides of the upper opening V21 and the lower opening V22 with the insulating film 321 and the barrier metal layer 322 interposed therebetween.

For example, the metal layers 313 and 323 are formed under the following conditions.

Forming Conditions of Metal Layers
material: Cu
forming method: plating method

As shown in FIG. 6, the conductive connection layer 401 is formed on the top surface of the insulating film 102. The conductive connection layer 401 is formed of a conductive metal material so as to electrically connect the pad interconnection 110P formed in the sensor substrate 100 to the pad interconnection 210P formed in the logic substrate 200. Specifically, the conductive connection layer 401 is formed to electrically connect the pad interconnections 110P and 210P to each other via the barrier metal layers 312 and 322 and the metal layers 313 and 323 formed in the pad openings V1 and V2.

Thereafter, as shown in FIG. 5, the color filter CF is formed in the pixel area PA and the on-chip lenses OCL are formed.

C. Conclusion

As described above, in this embodiment, the sensor substrate 100 having the pad interconnection 110P formed therein is formed (ST10). Then, the logic substrate 200 having the pad interconnection 210P formed therein is formed (ST20). Then, the sensor substrate 100 is bonded to the surface of the logic substrate 200 so as to face each other (ST30). Then, the sensor substrate 100 is thinned (ST40). Then, the pad opening V1 is formed on the surface of the pad interconnection 110P of the sensor substrate 100 and the pad opening V2 is formed on the surface of the pad interconnection 210P of the logic substrate 200 (ST50). Here, the etching process of simultaneously removing the parts formed on the pad interconnections 110P and 210P is performed on the stacked body of the sensor substrate 100 and the logic substrate 200. Accordingly, the pad openings V1 and V2 are formed to penetrate the semiconductor substrate 101 constituting the sensor substrate 100. Then, the pad interconnections 110P and 210P are electrically connected to each other via the pad openings V1 and V2 (ST60).

In this embodiment, in the step of forming the sensor substrate 100 (ST10), the etching stopper layer 110SP is formed on the surface of the pad interconnection 110P out of a material having an etching rate lower than that of the pad interconnection 110P of the sensor substrate 100 in the etching process.

When the etching stopper layer 110SP as formed in this embodiment is not formed on the surface of the pad interconnection 110P, the following problems occur.

Specifically, when the pad openings V1 and V2 having different depths are formed through the use of the etching process of simultaneously removing the parts on the pad interconnections 110P and 210P as in this embodiment, the pad interconnection 110P having a shallow pad opening V1 may be damaged. That is, to form the deep pad opening V2 on the pad interconnection 210P, the pad interconnection 110P having the shallow pad opening V1 is over-etched. Therefore, since the thickness of the pad interconnection 110P may be reduced or a through-hole may be formed in the pad interconnection 110P, the resistance value thereof may vary and the device reliability or characteristics such as the production yield may be lowered.

However, in this embodiment, the etching stopper layer 110SP is formed on the surface of the pad interconnection 110P.

Accordingly, in this embodiment, when the etching process of simultaneously forming the pad openings V1 and V2 having different depths is performed, the pad interconnection 110P is not etched and the etching is stopped at the etching stopper layer 110SP. That is, the etching stopper layer 110SP protects the pad interconnection 110P from the etching process and thus the pad interconnection 110P is not over-etched.

Therefore, since it is possible to suppress the reduction in thickness of the pad interconnection 110P or the formation of a through-hole in the pad interconnection 110P, it is possible to prevent the resistance value from varying.

Therefore, in this embodiment, it is possible to improve the device reliability or the characteristics such as the production yield.

D. Modification

It has been described above in the embodiment that the etching stopper layer 110SP is formed of an insulating material such as P—SiN, P—SiON, or P—SiCN, but the embodiment is not limited to this configuration.

The etching stopper layer 110SP may be formed of a barrier metal material having a diffusion coefficient smaller than that of the pad interconnection 110P. For example, a barrier metal film such as a Ti film and a TiN film formed through film forming methods such as a sputtering method and a CVD method can be very suitably used as the etching stopper layer 110SP. At this time, plural barrier metal layers such as the Ti layer or the TiN layer may be stacked to form the etching stopper layer 110SP.

In this case, the etch-back process is performed, for example, under the following conditions. In this modification, since Ti and TiN are conductive, the etching stopper layer 110SP may be left on the pad interconnection 110P.
Conditions of Etch-Back Process (when the Etching Stopper Layer 110SP is Formed of Ti or TiN)
 temperature: normal temperature
 pressure: 10 to 70 mTorr
 source power: 700 to 2000 W
 gas flow ratio: $C_4F_8/Ar/O_2$=9/1/1
 substrate bias: 50 to 300 W for 30 seconds to 2 minutes
 selectivity ratio of the underlying etching stopper layer: 2 or more As in this modification, when the etching stopper layer 110SP is formed to serve as the barrier metal layer, it is possible to reduce the number of process steps, compared with the case where plural layers are formed by the functions. Accordingly, it is possible to easy achieve an improvement in production efficiency and a decrease in cost.

In addition to the modification, the etching stopper layer 110SP may be formed of an organic material such as methyl silsesquioxane (MSQ), polyimde, polyarylene (Par) of organic SOG, and a polyarylether (PAE).

The camera 40 in the embodiment is an example of an electronic apparatus in the present disclosure. The solid-state imaging device 1 in the embodiment is an example of the semiconductor device in the present disclosure. The sensor substrate 100 in the embodiment is an example of the first circuit substrate in the present disclosure. The semiconductor substrate 101 in the embodiment is an example of the first semiconductor substrate in the present disclosure. The interconnection layer 110 in the embodiment is an example of the first interconnection layer in the present disclosure. The pad interconnection 110P in the embodiment is an example of the first interconnection in the present disclosure. The pad opening V1 in the embodiment is an example of the first opening in the present disclosure. The photodiode 21 in the embodiment is an example of the photoelectric conversion element in the present disclosure. The logic substrate 200 in the embodiment is an example of the second circuit substrate in the present disclosure. The semiconductor substrate 201 in the embodiment is an example of the second semiconductor substrate in the present disclosure. The interconnection layer 210 in the embodiment is an example of the second interconnection layer in the present disclosure. The pad interconnection 210P in the embodiment is an example of the second interconnection in the present disclosure. The pad opening V2 in the embodiment is an example of the second opening in the present disclosure. The etching stopper layer 110SP in the embodiment is an example of the etching stopper layer in the present disclosure.

2. Embodiment 2

A. Device Configuration

FIG. 16 is a diagram illustrating a part of a solid-state imaging device according to Embodiment 2.

Here, FIG. 16 shows a section taken along line XVI-XVI of FIG. 4, similarly to FIG. 6.

As shown in FIG. 16, in this embodiment, a barrier metal layer 110BM is formed. A barrier insulating film 110BZ is formed. This embodiment is equal to Embodiment 1, except these points and points associated therewith. Accordingly, the same elements will not be described again.

As shown in FIG. 16, the pad interconnection 110P is formed in the sensor substrate 100 in the pad section PAD.

Here, as shown in FIG. 16, the barrier metal layer 110BM is formed to coat the surface and the side surface of the pad interconnection 110P of the sensor substrate 100, unlike Embodiment 1 (see FIG. 6).

As shown in FIG. 16, the barrier insulating film 110BZ is formed in the interconnection layer 110, unlike Embodiment 1 (see FIG. 6).

B. Manufacturing Method

A part of a method of manufacturing the solid-state image device will be described below.

FIGS. 17A to 17C and FIGS. 18A to 18C are diagrams illustrating a part of the method of manufacturing the solid-state imaging device according to Embodiment 2.

FIGS. 17A to 17C and FIGS. 18A to 18C are sectional views illustrating the same section as shown in FIG. 16. FIGS. 17A to 17C and FIGS. 18A to 18C illustrates the process of step ST10 in FIG. 8. Subsequent steps ST20 to ST60 are performed in the same way as in Embodiment 1 to manufacture a solid-state imaging device.

The process steps of manufacturing the solid-state imaging device will be sequentially described below.

When forming the sensor substrate 100 (ST10 in FIG. 8), the photodiodes 21 are formed in the pixel area PA of the semiconductor substrate 101 (see FIG. 5), similarly to Embodiment 1. Semiconductor circuit elements (not shown) such as the pixel transistor Tr (see FIG. 7) are formed on the surface (the top surface in FIGS. 17A to 17C) of the semiconductor substrate 101.

As shown in FIGS. 17A to 17C and FIGS. 18A to 18C, the interconnection layer 110 is formed to coat the entire surface (top surface) of the semiconductor substrate 101. The insulating film 120 is formed to coat the entire surface (top surface) of the semiconductor substrate 101 with the interconnection layer 110 interposed therebetween.

Specifically, as shown in FIG. 17A, a first-layer insulating film 110Za constituting the interconnection layer 110 is formed on the entire surface (top surface) of the semiconductor substrate 101. The etching stopper layer 110SP is formed on the surface (top surface) of the semiconductor substrate 101 with the insulating film 110Za interposed therebetween.

An etching stopper material layer (not shown) is formed on the surface (top surface) of the semiconductor substrate 101 with the insulating film 110Za interposed therebetween, for example, under the following conditions. By patterning the etching stopper material layer (not shown), the etching stopper layer 110SP is formed.

Forming Conditions of Etching Stopper Material Layer
  material: P—SiN, P—SiON, P—SiCN, or the like
  thickness: 100 to 200 nm
  forming method: plasma CVD method
  gas flow ratio: $SiH_4:NH_3:N_2=1:1:20$
  source power: 50 to 1000 W
  pressure: 1 to 10 Torr
  forming temperature: 300° C. to 400° C. for 30 seconds to 2 minutes Then, as shown in FIG. 17B, a second-layer insulating film 110Zb is formed on the surface (top surface) of the first-layer insulating film 110Za so as to coat the etching stopper layer 110SP.

Then, as shown in FIG. 17C, a trench TR is formed. Here, the trench TR is formed by removing a part of the second-layer insulating film 110Zb so as to expose the surface (top surface) of the etching stopper layer 110SP. For example, by performing a dry etching process under the following conditions, the trench TR with a depth of 200 to 400 nm is formed.

Conditions of Dry Etching Process
  temperature: normal temperature
  pressure: 30 to 100 mTorr
  source power: 50 to 2500 W
  gas flow ratio: $C_5F_8/Ar/O_2=6/1/1$
  substrate bias: 700 to 2000 W for 30 seconds to 2 minutes
  selectivity ratio of the underlying etching stopper layer: 10

As shown in FIG. 18A, the barrier metal layer 110BM and the pad interconnection 110P are formed.

The barrier metal layer 110BM is formed by coating the side surface and the bottom surface of the trench TR with a barrier metal material.

For example, the barrier metal layer 110BM is formed, for example, under the following conditions. Plural films may be stacked to form the barrier metal layer 110BM.

thickness: 30 to 50 nm
  material: metal material such as TiN, Ti, TaN, and Ta

The pad interconnection 110P is formed by filling the inside of the trench TR, of which the side surface and the bottom surface are coated with the barrier metal layer 110BM, with a conductive material. For example, the pad interconnection 110P is formed of a conductive material such as Cu and W.

In this step, a film of a barrier metal material is formed on the surface of the second-layer insulating film 110Zb so as to coat the side surface and the bottom surface of the trench TR. A film of a conductive material is formed on the surface of the second-layer insulating film 110Zb so as to fill the inside of the trench TR. Thereafter, the barrier metal material layer and the conductive material layer are removed from the top surface of the second-layer insulating film 110Zb by performing an etch-back process or a CMP process. As a result, the barrier metal layer 110BM and the pad interconnection 110P are formed in the trench TR.

As shown in FIG. 18B, the barrier insulating film 110BZ is formed.

The barrier insulating film 110BZ is formed, for example, under the following conditions.

Forming Conditions of Barrier Insulating Film
  material: P—SiN, P—SiON, P—SiCN, or the like
  thickness: 30 to 200 nm
  forming method: plasma CVD method (for example, a ratio of $SiH_4/N_2O/N_2$ of 1:1:10, a pressure of 0.5 to 10 Torr, source power of 50 to 1000 W, a temperature of 300° C. to 400° C., and a process time of 30 seconds to 2 minutes in case of P—SiN)

As described above, the pad interconnection 110P is formed through a so-called damascene method. Although not shown, the other interconnections constituting the interconnection layer 110 in the pixel area PA are formed through the same processes as forming the pad interconnection 110P.

Then, as shown in FIG. 18C, the insulating film 120 is formed after the interconnection layer 110 is completed.

Here, the interconnection layer 110 is completed by alternately forming the insulating film and the interconnection. For example, the damascene method is performed as described above to complete the interconnection layer 110. The insulating film 120 is formed on the surface of the interconnection layer 110.

In this way, the sensor substrate 100 is formed (step ST10 in FIG. 8).

Then, as shown in FIG. 8, the formation of the logic substrate 200 (ST20), the bonding of the sensor substrate 100 and the logic substrate 200 (ST30), and the thinning of the sensor substrate 100 (ST40) are performed. Thereafter, the formation of the pad openings V1 and V2 (ST50) and the connection of the sensor substrate 100 to the logic substrate 200 (ST60) are performed. The process steps are performed in the same way as in Embodiment 1.

As a result, the solid-state imaging device is completed as shown in FIG. 16.

C. Conclusion

As described above, in this embodiment, the etching stopper layer 110SP is formed on the surface of the pand interconnection 110P having the pad opening V1 shallower than the deep pad opening V2 formed in the pad interconnection 210P, similarly to Embodiment 1.

Accordingly, in this embodiment, even when the etching process of simultaneously forming the pad openings V1 and V2 having different depths is performed, the pad interconnection 110P is not etched, similarly to Embodiment 1. That is, the etching stopper layer 110SP protects the pad interconnection 110P from the etching process and thus the pad interconnection 110P is not over-etched.

Therefore, since it is possible to suppress a reduction in thickness of the pad interconnection 110P or a formation of a through-hole in the pad interconnection 110P, it is possible to prevent a variation in resistance value.

As a result, in this embodiment, it is possible to improve the device reliability or the characteristics of the production yield.

3. Embodiment 3

A. Device Configuration

Figure 19:
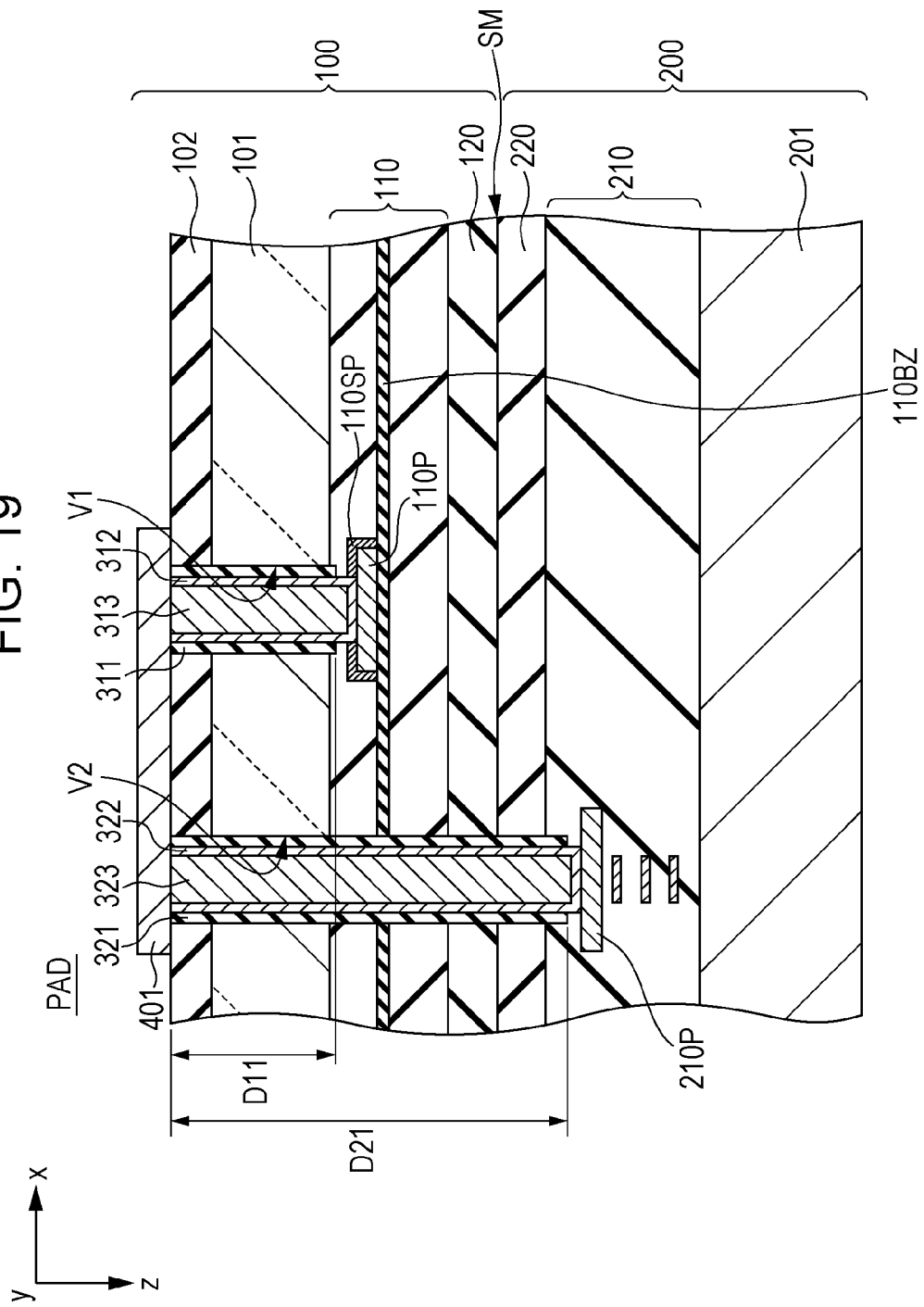
FIG. 19 is a diagram illustrating a partial configuration of a solid-state imaging device according to Embodiment 3.

FIG. 19 is a diagram illustrating a part of a solid-state imaging device according to Embodiment 3.

Here, FIG. 19 shows a section taken along line XIX-XIX of FIG. 4, similarly to FIG. 6.

As shown in FIG. 19, this embodiment is different from Embodiment 1, in the etching stopper layer 110SP. In addition, a barrier insulating film 110BZ is formed. This embodiment is equal to Embodiment 1, except these points and points associated therewith. Accordingly, the same elements will not be described again.

As shown in FIG. 19, the pad interconnection 110P is formed in the sensor substrate 100 in the pad section PAD.

Here, as shown in FIG. 19, the etching stopper layer 110SP is formed to coat the surface and the side surface of the pad interconnection 110P of the sensor substrate 100, unlike Embodiment 1 (see FIG. 6).

As shown in FIG. 19, the barrier insulating film 110BZ is formed in the interconnection layer 110, unlike Embodiment 1 (see FIG. 6).

B. Manufacturing Method

A part of a method of manufacturing the solid-state image device will be described below.

Figure 20A:
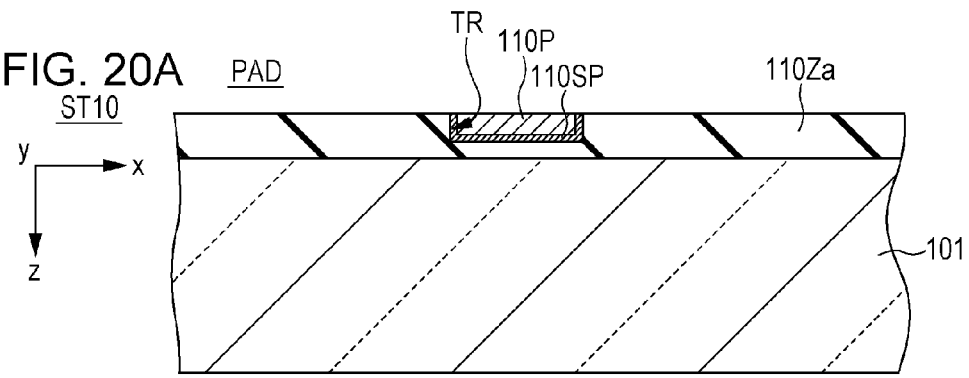
FIGS. 20A to 20C are diagrams illustrating a part of a method of manufacturing a solid-state imaging device according to Embodiment 3.
Figure 20B:
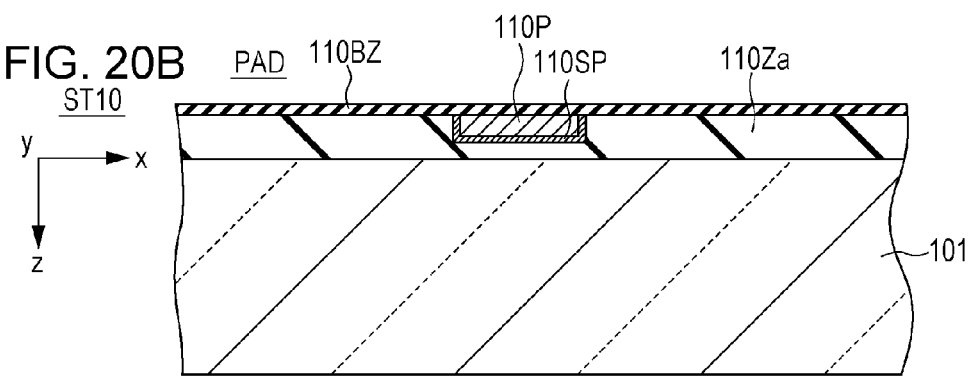
Figure 20C:
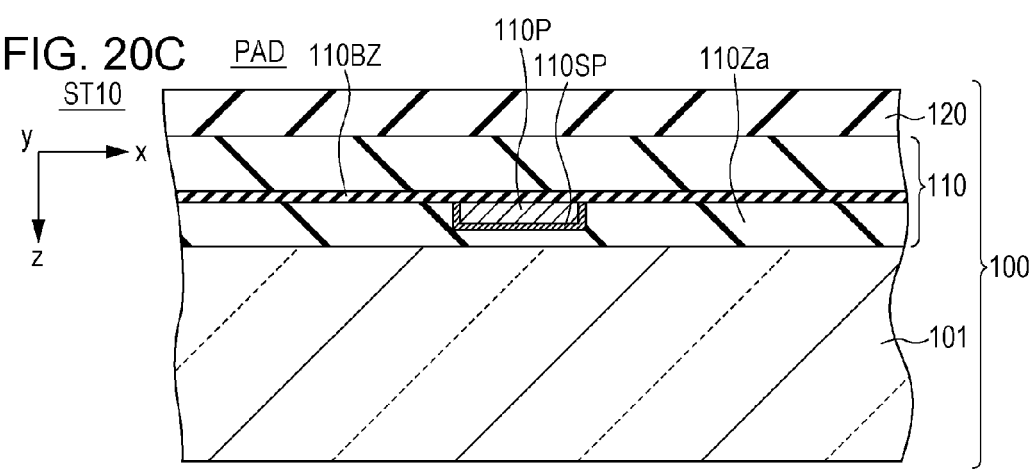

FIGS. 20A to 20C are diagrams illustrating a part of the method of manufacturing the solid-state imaging device according to Embodiment 3.

FIGS. 20A to 20C are sectional views illustrating the same section as shown in FIG. 19. FIGS. 20A to 20C illustrate the process of step ST10 in FIG. 8. Subsequent steps ST20 to ST60 are performed in the same way as in Embodiment 1 to manufacture a solid-state imaging device.

The process steps of manufacturing the solid-state imaging device will be sequentially described below.

When forming the sensor substrate 100 (ST10 in FIG. 8), the photodiodes 21 are formed in the pixel area PA of the semiconductor substrate 101 (see FIG. 5), similarly to Embodiment 1. Semiconductor circuit elements (not shown) such as the pixel transistor Tr (see FIG. 7) are formed on the surface (the top surface in FIGS. 17A to 17C) of the semiconductor substrate 101.

As shown in FIGS. 20A to 20C, the interconnection layer 110 is formed to coat the entire surface (top surface) of the semiconductor substrate 101. The insulating film 120 is formed to coat the entire surface (top surface) of the semiconductor substrate 101 with the interconnection layer 110 interposed therebetween.

Specifically, as shown in FIG. 20A, a first-layer insulating film 110Za constituting the interconnection layer 110 is formed on the entire surface (top surface) of the semiconductor substrate 101.

A trench TR is formed by removing a part of the first-layer insulating film 110Za. For example, by performing a dry etching process, the trench TR with a depth of 200 to 400 nm is formed.

Thereafter, the etching stopper layer 110SP and the pad interconnection 110P are formed in the trench TR.

The etching stopper layer 110SP is formed to coat the side surface and the bottom surface of the trench TR with a barrier metal material. For example, the etching stopper layer 110SP is formed under the following conditions. Plural films may be stacked to form the etching stopper layer 110SP.

thickness: 70 to 100 nm
material: metal material such as TiN, Ti, TaN, and Ta

The pad interconnection 110P is formed by filling the inside of the trench TR of which the side surface and the bottom surface are coated with the etching stopper layer 110SP with a conductive material. For example, the pad interconnection 110P is formed of a conductive material such as Cu or W.

In this step, a film of a barrier metal material is formed on the surface of the first-layer insulating film 110Za so as to coat the side surface and the bottom surface of the trench TR. A film of a conductor material is formed on the top surface of the first-layer insulating film 110Za so as to fill the inside the trench TR. Thereafter, by performing an etch-back process or a CMP process, the barrier metal material layer and the conductive material layer from the surface of the first-layer insulating film 110Za. Accordingly, the etching stopper layer 110SP and the pad interconnection 110P are formed in the trench TR.

Then, as shown in FIG. 20B, a barrier insulating film 110BZ is formed. For example, the barrier insulating film 110BZ is formed under the same conditions as in Embodiment 2.

As described above, the pad interconnection 110P is formed through a so-called damascene method. Although not shown, the other interconnections constituting the interconnection layer 110 in the pixel area PA are formed through the same processes as forming the pad interconnection 110P.

Then, as shown in FIG. 20C, the insulating film 120 is formed after the interconnection layer 110 is completed.

Here, the interconnection layer 110 is completed by alternately forming the insulating film and the interconnection. For example, the damascene method is performed as described above to complete the interconnection layer 110. The insulating film 120 is formed on the surface of the interconnection layer 110.

By performing various process steps in this way, the sensor substrate 100 is formed (step ST10 in FIG. 8).

Then, as shown in FIG. 8, the formation of the logic substrate 200 (ST20), the bonding of the sensor substrate 100 and the logic substrate 200 (ST30), and the thinning of the sensor substrate 100 (ST40) are performed. Thereafter, the formation of the pad openings V1 and V2 (ST50) and the connection of the sensor substrate 100 to the logic substrate 200 (ST60) are performed. The process steps are performed in the same way as in Embodiment 1.

Here, the etch-back process of forming the pad openings V1 and V2 (ST50) is performed under the same conditions as the modification of Embodiment 1.

As a result, the solid-state imaging device is completed, as shown in FIG. 19.

In this embodiment, the metal layer 313 and the pad interconnection 110P are directly connected to each other without the etching stopper layer 110SP interposed therebetween, as shown in FIG. 19. That is, similarly to Embodiment 1, the etching stopper layer 110SP is removed from the surface of the pad interconnection 110P coming in contact with the metal layer 313 after performing the etch-back process for forming the pad openings V1 and V2 (ST50). However, this embodiment is not limited to this configuration. In this embodiment, the etching stopper layer 110SP is formed of a barrier metal material and thus the etching stopper layer 110SP has conductivity. Accordingly, the etching stopper layer 110SP may be interposed between the metal layer 313 and the pad interconnection 110P.

C. Conclusion

As described above, in this embodiment, the etching stopper layer 110SP is formed on the surface of the pand interconnection 110P having the pad opening V1 shallower than the deep pad opening V2 formed in the pad interconnection 210P, similarly to Embodiment 1.

Accordingly, in this embodiment, even when the etching process of simultaneously forming the pad openings V1 and V2 having different depths is performed, the pad interconnection 110P is not etched, similarly to Embodiment 1. That is, the etching stopper layer 110SP protects the pad interconnection 110P from the etching process and thus the pad interconnection 110P is not over-etched.

Therefore, since it is possible to suppress a reduction in thickness of the pad interconnection 110P or a formation of a through-hole in the pad interconnection 110P, it is possible to prevent a variation in resistance value.

As a result, in this embodiment, it is possible to improve the device reliability or the characteristics of the production yield.

In this embodiment, when the etching stopper layer 110SP is formed to serve as the barrier metal layer, it is possible to reduce the number of process steps, compared with the case where plural layers are formed by the functions. Accordingly, it is possible to easy achieve an improvement in production efficiency and a decrease in cost.

4. Embodiment 4

A. Device Configuration

Figure 21:
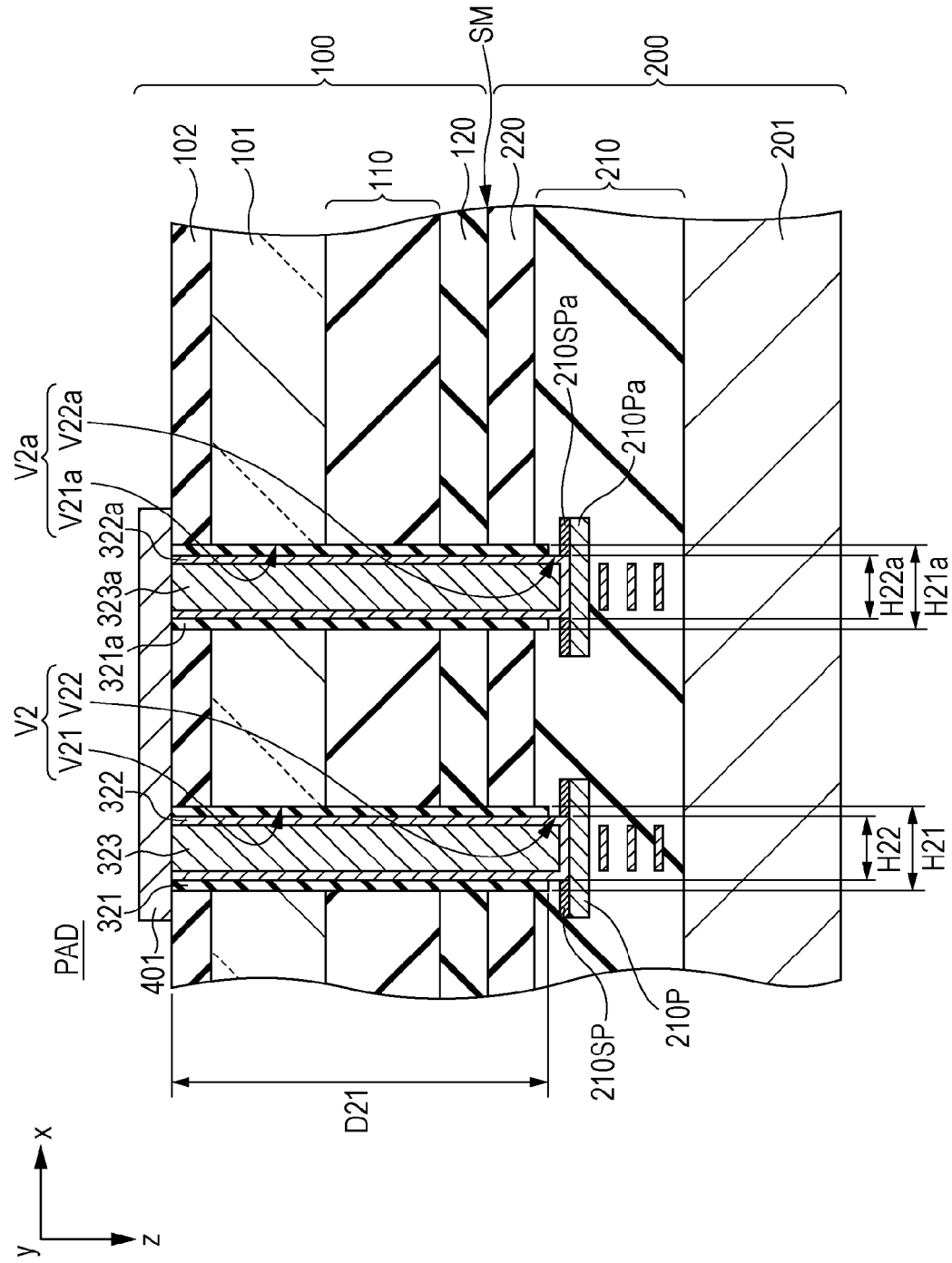
FIG. 21 is a diagram illustrating a partial configuration of a solid-state imaging device according to Embodiment 4.

FIG. 21 is a diagram illustrating a part of a solid-state imaging device according to Embodiment 4.

Here, FIG. 21 shows a section taken along line XXI-XXI of FIG. 4, similarly to FIG. 6.

As shown in FIG. 21, this embodiment is different from Embodiment 1, in a partial configuration of the pad section PAD. Specifically, the pad openings V2a and V2 having different widths are formed on above the plural pad interconnections 210Pa and 210P formed in the logic substrate 200. This embodiment is equal to Embodiment 1, except these points and points associated therewith. Accordingly, the same elements will not be described again.

a-1. Pad Interconnections of Logic Substrate

In the pad section PAD, as shown in FIG. 21, the pad interconnections 210Pa and 210P are formed in the logic substrate 200.

The plural pad interconnections 210Pa and 210P formed in the logic substrate 200 are formed in the interconnection layer 210, as shown in FIG. 21.

Specifically, the pad interconnections 210Pa and 210P are formed in the insulating film 210Z constituting the interconnection layer 210. The pad interconnections 210Pa and 210P are formed a conductive metal material, for example, similarly to the other interconnections 210H constituting the interconnection layer 210.

The pad interconnections 210Pa and 210P are electrically connected to the other interconnections 210H and thus semiconductor circuit elements (not shown) formed in the logic substrate 200 are electrically connected to each other. Here, the pad interconnections 210Pa and 210P are electrically connected to each other.

a-2. Pad Opening

As shown in FIG. 21, pad openings V2a and V2 are formed above the plural pad interconnections 210Pa and 210P. The pad interconnections 210Pa and 210P are formed to penetrate at least the semiconductor substrate 101.

Here, etching stopper layers 210SPa and 210SP are formed on the surfaces of the pad interconnections 210Pa and 210P. The pad openings V2a and V2 are formed to pass from the surfaces of the etching stopper layers 210SPa and 210SP to the top surface of the insulating film 102.

The etching stopper layers 210SPa and 210SP are formed to stop the etching process when removing the parts formed thereon through the etching process. That is, the etching stopper layers 210SPa and 210SP are formed of a material having an etching rate lower than that of the parts formed thereon. In order to prevent the pad interconnections 210Pa and 210P from being damaged due to the etching process, the etching stopper layers 210SPa and 210SP are formed of a material having an etching rate lower than that of the pad interconnections 210Pa and 210P. In this embodiment, the etching stopper layer 210SP is formed of a barrier metal material having a diffusion coefficient smaller than that of the pad interconnections 210Pa and 210P.

Although details will be described later, the pad openings V2a and V2 are formed through the same process. That is, the pad openings V2a and V2 are formed by removing the parts formed on the pad interconnections 210Pa and 210P through the etching process.

As shown in FIG. 21, the pad openings V2a and V2 include the upper openings V21a and V21 and the lower openings V22a and V22, and the upper openings V21a and V21 and the lower openings V22a and V22 are disposed to overlap with each other in the depth direction z.

In the pad openings V2a and V2, the upper openings V21a and V21 are formed to pass the top of the interconnection layer 210 in the logic substrate 200 to the top surface of the insulating film 102, as shown in FIG. 21. That is, in the stacked body of the sensor substrate 100 and the logic substrate 200, the upper openings V21a and V21 penetrate the part formed on the pad interconnection 210P in the interconnection layer 210 of the logic substrate 200.

In the pad openings V2a and V2, the upper openings V21a and V21 have the same planar shape, except that the widths H21a and H21b thereof are different from each other. The upper openings V21a and V21 have the same depth.

In the pad openings V2a and V2, the lower openings V22a and V22 are formed to expose the top surface of the pad interconnection 210P in the logic substrate 200, as shown in FIG. 21. That is, in the stacked body of the sensor substrate 100 and the logic substrate 200, the lower openings V22a and V22 are formed to penetrate the part formed on the interconnection layer 210 in the logic substrate 200.

In the pad openings V2a and V2, the lower openings V22a and V22 have the same planar shape, except that the widths H22a and H22b are different from each other. The lower openings V22a and V22 have the same depth.

Insulating films 321a and 321, barrier metal layers 322a and 322, and metal layers 323a and 323 are formed in the pad openings V2a and V2, respectively.

Here, the insulating films 321a and 321 are formed to coat the side surfaces of the upper openings V21a and V21 in the pad openings V2a and V2.

The barrier metal layers 322a and 322 are formed to coat the side surfaces of the upper openings V21a and V21 with the insulating films 321a and 321 interposed therebetween. The barrier metal layers 322a and 322 coats the bottom surfaces in addition to the side surfaces of the lower openings V22a and V22.

The metal layers 323a and 323 are formed to fill the inside of the upper openings V21a and V21 and the lower openings V22a and V22 with the insulating films 321a and 321 and the barrier metal layers 322a and 322.

a-3. Conductive Connection Layer

In addition, the conductive connection layer 401 is formed in the pad section PAD, as shown in FIG. 21. The conductive connection layer 401 is formed on the top surface of the insulating film 102.

The conductive connection layer 401 is formed of a conductive metal material so as to electrically connect the pad interconnections 210Pa and 210P formed in the logic substrate 200 to each other. Here, the conductive connection layer 401 electrically connects the pad interconnections 210Pa and 210P through the barrier metal layers 322a and 322 and the metal layers 323a and 323 formed in the pad openings V2a and V2.

B. Manufacturing Method

A part of the method of manufacturing the solid-state imaging device 1 will be described.

FIGS. 22A to 25 are diagrams illustrating a part of the method of manufacturing a solid-state imaging device according to Example 4.

FIGS. 22A to 25 are sectional views illustrating the same section as shown in FIG. 21.

In this embodiment, a solid-state imaging device is manufactured by performing steps ST10 to ST60 shown in FIG. 8.

Specifically, as shown in FIG. 8, the sensor substrate 100 is formed (ST10), similarly to Embodiment 1.

Then, s shown in FIG. 8, the logic substrate 200 is formed (ST20).

In this embodiment, the etching stopper layers 210SPa and 210SP are formed on the top surfaces of the pad interconnections 210Pa and 210P as shown in FIGS. 22A and 22B, unlike Embodiment 1.

Specifically, as shown in FIG. 22A, when forming the interconnection layer 210, the pad interconnections 210Pa and 210P are formed and then the etching stopper layers 210SPa and 210SP are formed on the top surfaces thereof. The etching stopper layers 210SPa and 210SP are formed, for example, through the same process as forming the etching stopper layer 110SP (see FIG. 6) in Embodiment 1. That is, the etching stopper layers 210SPa and 210SP are formed of P—SiN or the like. Then, the interconnection layer 210 is completed by forming the insulating film constituting the interconnection layer 210 so as to coat the etching stopper layers 210SPa and 210SP.

As shown in FIG. 22B, the insulating film 220 is formed to coat the entire surface (top surface) of the interconnection layer 210.

Thereafter, as shown in FIG. 8, the bonding of the sensor substrate 100 and the logic substrate 200 (ST30) and the thinning of the sensor substrate 100 (ST40) are performed. The process steps are performed in the same way as in Embodiment 1.

As shown in FIG. 8, the pad openings V2a and V2 (see FIG. 21) are formed (ST50).

Figure 23:
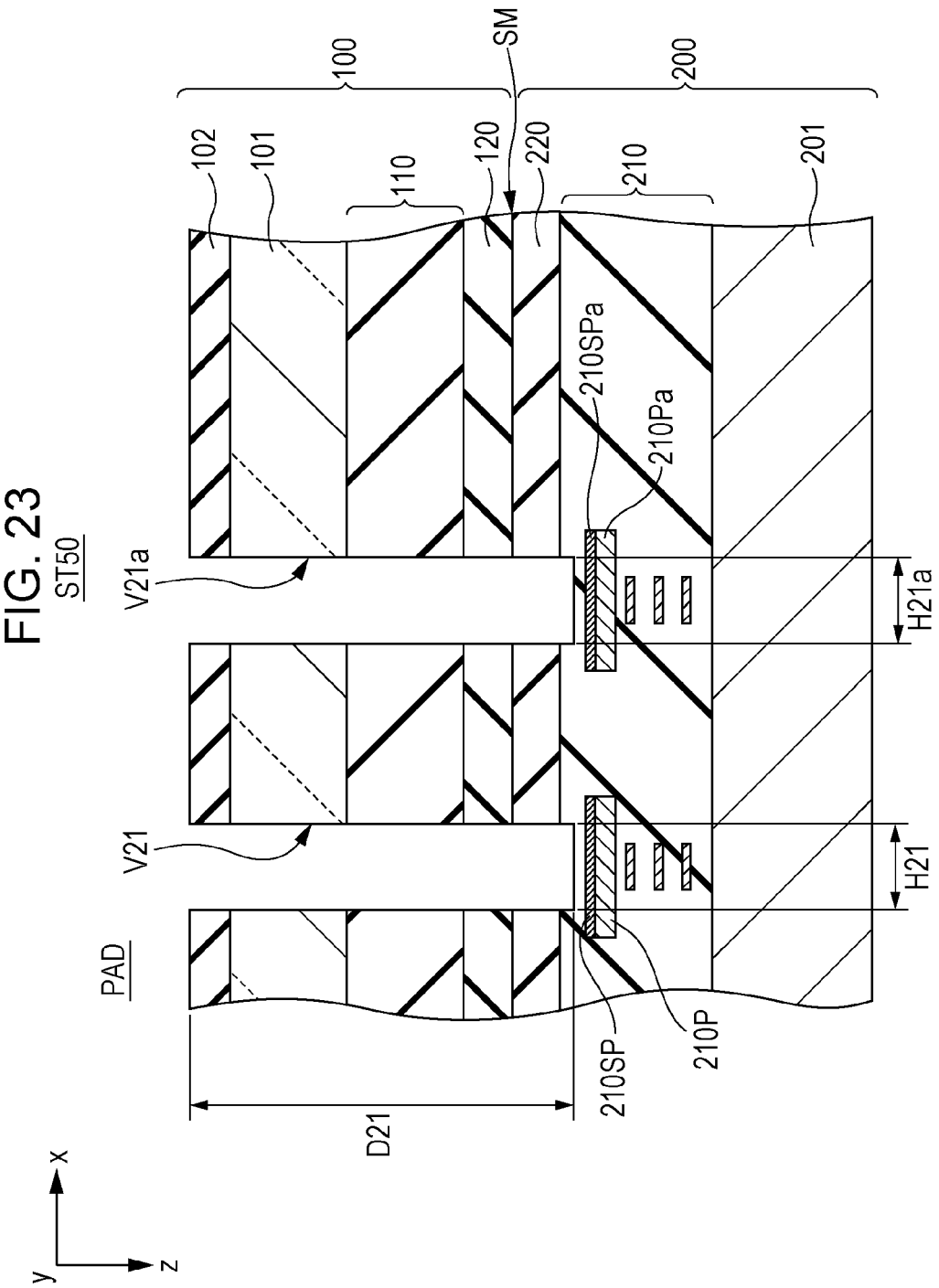
FIG. 23 is a diagram illustrating a part of the method of manufacturing the solid-state imaging device according to Embodiment 4.
Figure 24:
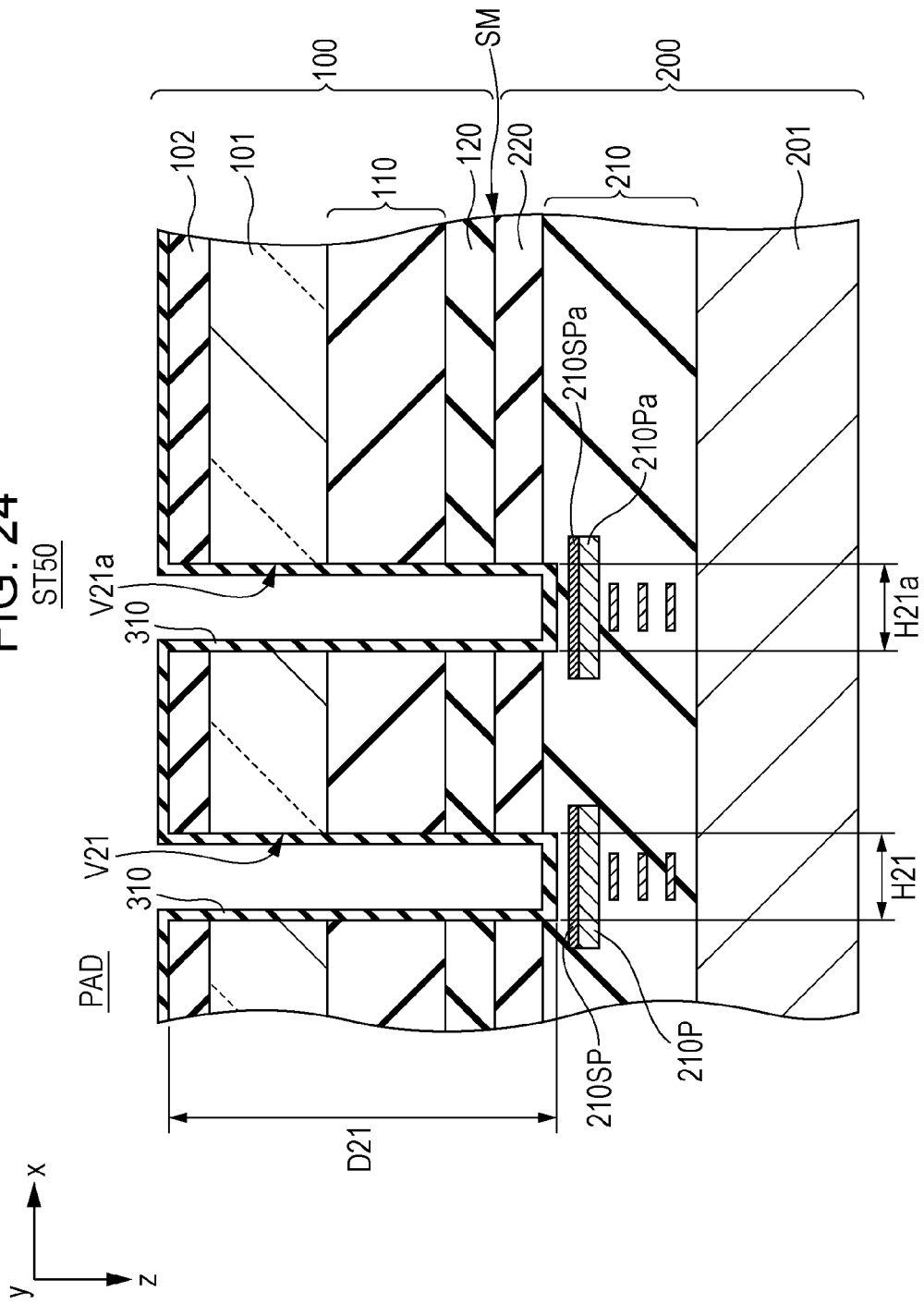
FIG. 24 is a diagram illustrating a part of the method of manufacturing the solid-state imaging device according to Embodiment 4.

Here, the pad openings V2a and V2 (see FIG. 21) are formed by sequentially performing the process steps of FIGS. 23 to 25.

Specifically, first, the insulating film 102 is formed on the rear surface (top surface) of the semiconductor substrate 101 constituting the sensor substrate 100 and then the upper openings V21a and V21 constituting the pad openings V2a and V2 (see FIG. 21) are formed thereon, as shown in FIG. 23.

Here, in the pad section PAD, the upper openings V21a and V21 are formed above the pad interconnections 210Pa and 210P formed in the logic substrate 200. The upper openings V21a and V21 are formed to pass from the parts above the pad interconnections 210Pa and 210P formed in the logic substrate 200 to the top surface of the insulating film 102. That is, the upper openings V21a and V21 are formed by removing the parts formed higher than the position where the top surfaces of the pad interconnections 210Pa and 210P are not exposed in the sensor substrate 100 and the logic substrate 200. In this way, by removing the parts just on the pad interconnections 210Pa and 210P formed in the logic substrate 200, the upper openings V21a and V21 are formed.

The upper openings V21a and V21 having different widths H21a and H21 are formed, for example, under the following conditions.

Wide Upper Opening
    width H21a: 1 to 5 μm
Narrow Upper Opening
    width H21: 500 nm to 2 μm As shown in FIG. 24, the insulating film 310 is formed to coat the surface (top surface) of the sensor substrate 100 opposite to the surface (bottom surface) facing the logic substrate 200.

Here, the insulating film 310 is formed on the surface of the sensor substrate 100 so as to coat the side surfaces and the bottom surfaces of the upper openings V21a and V21. The insulating film 310 is formed, for example, under the same conditions as in Embodiment 1.

Then, as shown in FIG. 25, the lower openings V22a and V22 constituting the pad openings V2a and V2b (see FIG. 21) are formed.

Here, the lower openings V22a and V22 are formed above the pad interconnections 210Pa and 210P formed in the logic substrate 200. The lower openings V22a and V22 are formed to expose the surfaces of the pad interconnections 210Pa and 210P in the logic substrate 200. That is, in the stacked body of the sensor substrate 100 and the logic substrate 200, the lower openings V22a and V22 are formed to penetrate the parts formed on the interconnection layer 210 of the logic substrate 200.

For example, by removing the parts formed on the pad interconnections 210Pa and 210P through the use of the etch-back process, the lower openings V22a and V22 are formed. At this time, the etching process is performed so as to remove the parts on the pad interconnections 210Pa and 210P up to the middle parts of the etching stopper layers 210SPa and 210SP.

Accordingly, as shown in FIG. 25, above the pad interconnections 210Pa and 210P of the logic substrate 200, the insulating films 321a and 321 are formed to coat the side surfaces of the upper openings V21a and V21.

Thereafter, although not shown in FIG. 25, the etching stopper layers 210SPa and 210SP remaining on the surfaces of the pad interconnections 210Pa and 210P are removed from the parts in which the lower openings V22a and V22 are formed. Accordingly, the surfaces of the pad interconnections 210Pa and 210P are exposed to complete the lower openings V22a and V22.

For example, a photo resist pattern (not shown) is formed to open the parts corresponding to the etching stopper layers 210SPa and 210SP remaining in the parts in which the lower openings V22a and V22 are formed and to coat the other part. Then, by performing an etching process using the photo resist pattern (not shown) as a mask, the etching stopper layers 210SPa and 210SP are removed from the pad interconnections 210Pa and 210P.

Then, as shown in FIG. 8, the connection of the sensor substrate 100 and the logic substrate 200 (ST60) is performed.

Here, as shown in FIG. 21, the sensor substrate 100 and the logic substrate 200 are electrically connected to each other.

Specifically, as shown in FIG. 21, the barrier metal layers 322a and 322 are formed to coat the side surfaces of the upper openings V21a and V21 and the side surfaces and the bottom surfaces of the lower openings V22a and V22 with the insulating film 321a and 321 interposed therebetween.

Then, as shown in FIG. 21, the metal layers 323a and 323 are formed to fill the insides of the upper openings V21a and V21 and the lower openings V22a and V22 with the insulating films 321a and 321 and the barrier metal layers 322a and 322 interposed therebetween.

As shown in FIG. 21, the conductive connection layer 401 is formed on the surface of the insulating film 102. The conductive connection layer 401 is formed of a conductive metal material so as to electrically connect the pad interconnections 210Pa and 210P formed in the logic substrate 200 to each other.

Thereafter, as shown in FIG. 5, the color filter CF is formed in the pixel area PA and then the on-chip lenses OCL are formed thereon.

C. Conclusion

As described above, in this embodiment, the sensor substrate 100 is formed (ST10). Then, the logic substrate 200 having the pad interconnections 210Pa and 210P formed therein are formed (ST20). Then, the sensor substrate 100 is bonded to the surface of the logic substrate 200 so as to face ach other (ST30). Then, the sensor substrate 100 is thinned (ST40). Then, the pad opening V2a is formed above the surface of the pad interconnection 210Pa and the pad opening V2 narrower than the pad opening V2a is formed above the surface of the pad interconnection 210P (ST50). Here, by performing the etching process of simultaneously removing the parts formed on the pad interconnection 210Pa and the pad interconnection 210P on the stacked body of the sensor substrate 100 and the logic substrate 200, the pad openings V2a and V2 are formed at the same time. Then, the pad interconnections 210Pa and 210P are electrically connected to each other through the pad openings V2a and V2 (ST60).

When forming the logic substrate 200 (ST20), the etching stopper layer 210SPa is formed at least on the surface of the pad interconnection 210Pa having the wide pad opening V2a formed thereon. The etching stopper layer 210SPa is formed of a material having an etching rate lower than that of the pad interconnection 210Pa in the etching process for simultaneously forming the pad openings V2a and V2.

When the etching stopper layer 110SPa as formed in this embodiment is not formed on the top surface of the pad interconnection 210Pa having the wide pad opening V2a formed thereon, the following problems occur.

Specifically, when the pad openings V2a and V2 having different areas (different diameters or widths) are formed through the use of the etching process of simultaneously removing the parts on the pad interconnections 210Pa and 210P, the pad interconnection 210Pa having the wide pad opening V2a may be damaged. That is, to form the narrow pad opening V2 on the pad interconnection 210P, the pad interconnection 210Pa having the wide pad opening V2a is easily over-etched. Therefore, since the thickness of the pad interconnection 210Pa may be reduced or a through-hole may be formed in the pad interconnection 210Pa, the resistance value thereof may vary and the device reliability or characteristics such as the production yield may be lowered.

However, in this embodiment, the etching stopper layer 210SPa is formed on the surface of the pad interconnection 210Pa having the wide pad opening V2a formed thereon.

Accordingly, in this embodiment, when the etching process of simultaneously forming the pad openings V2a and V2 having different areas (different diameters or widths) is performed, the pad interconnection 210Pa is not etched and the etching is stopped at the etching stopper layer 210SPa. That is, the etching stopper layer 210SPa protects the pad interconnection 210Pa from the etching process and thus the pad interconnection 210Pa is not over-etched.

Therefore, since it is possible to suppress the reduction in thickness of the pad interconnection 210Pa having the wide pad opening V2a formed thereon or the formation of a through-hole in the pad interconnection 210Pa, it is possible to prevent the resistance value from varying.

Therefore, in this embodiment, it is possible to improve the device reliability or the characteristics such as the production yield.

In addition, in this embodiment, the etching stopper layer 210SP is also formed on the top surface of the pad interconnection 210P having the narrow pad opening V2 in addition to the top surface of the pad interconnection 210Pa having the wide pad opening V2a. Accordingly, since it is also possible to suppress the reduction in thickness of the pad interconnection 210P having the narrow pad opening V2 formed thereon and the formation of a through-hole in the pad interconnection 210P, it is possible to prevent the variation in resistance value.

The pad interconnection 210Pa in the embodiment is an example of the first interconnection in the present disclosure. The pad opening V2a in the embodiment is an example of the first opening in the present disclosure. The pad interconnection 210P is an example of the second interconnection in the present disclosure. The pad opening V2 in the embodiment is an example of the second opening in the present disclosure. The etching stopper layer 210SPa in the embodiment is an example of the etching stopper layer in the present disclosure.

5. Others

The embodiments are not limited to the above-mentioned, but may have various modifications.

It has been described in the above-mentioned embodiments that the pad opening is formed by superimposing the upper opening on the lower opening having a width smaller than that of the upper opening in the depth direction z, but the embodiments are not limited to this configuration. The pad opening may be formed by superimposing three or more openings having different widths in the depth direction z. In addition to the case where a stepped portion is disposed between the upper opening and the lower opening, the pad opening may be formed without the stepped portion. That is, the pad opening may be formed to have the same width from the top to the bottom.

It has been described in the above-mentioned embodiments that the sensor substrate 100 and the logic substrate 200 are bonded through a plasma bonding, but the embodiments are not limited to this configuration. For example, both may be bonded to each other by the use of an adhesive.

It has been described in the above-mentioned embodiments that the sensor substrate 100 which is a backside illumination type CMOS image sensor is manufactured out of a silicon substrate, but the embodiments are not limited to this configuration. The sensor substrate 100 may be manufactured out of a so-called SOI (Silicon On Insulator) substrate.

It has been described in the above-mentioned embodiments that four types of the transfer transistor, the amplification transistor, the selection transistor, and the reset transistor are formed as the pixel transistor, but the embodiments are not limited to this configuration. For example, the present disclosure may be applied to a case where three types of the transfer transistor, the amplification transistor, and the reset transistor are formed as the pixel transistor.

It has been described in the above-mentioned embodiments that the transfer transistor, the amplification transistor, the selection transistor, and the reset transistor are formed for each photodiode, but the embodiments are not limited to this configuration. For example, the present disclosure may be applied to the case where the amplification transistor, the selection transistor, and the reset transistor are formed for plural photodiodes.

It has been described in the above-mentioned embodiments that the present disclosure is applied to the camera, but the embodiments are not limited to this configuration. The present disclosure may be applied to other electronic apparatuses having a solid-state imaging device such as a scanner or a copier.

It has been described in the above-mentioned embodiments that the sensor substrate 100 is a "backside illumination type" CMOS image sensor, but the embodiments are not limited to this configuration. The present disclosure may be applied to a "front illumination type". The present disclosure may be applied to a CCD image sensor as well as the CMOS image sensor.

It has been described in the above-mentioned embodiments that the sensor substrate 100 and the logic substrate 200 are bonded to each other, but the embodiments are not limited to this configuration. The present disclosure may be applied to the case where semiconductor chips other than the sensor substrate 100 and the logic substrate 200 are bonded to each other.

It has been described in the above-mentioned embodiments that plural pad openings having different depths are simultaneously formed by simultaneously removing the parts on plural pad interconnections. In addition, it has been described that plural pad openings having different areas (different widths or diameters) are simultaneously formed through the etching process. However, the embodiments are not limited to this configuration. It is very suitable that an etching stopper layer is formed at least on the surface of the pad interconnection which is more over-etched than the other pad interconnection out of the plural pad interconnections when simultaneously removing the parts on the plural pad interconnections through the use of the etching process.

It has been described in the above-mentioned embodiments that the insides of the pad openings are filled with the conductive material, but the embodiments are not limited to this configuration. Other connection members such as a bonding wire may be formed on the surfaces of the pad interconnections having the pad opening formed thereon.

In addition, the above-mentioned embodiments may be appropriately combined.

For example, the present technology may take the following configurations.

(1) A method of manufacturing a semiconductor device, including: forming a first circuit substrate having a first interconnection formed therein; forming a second circuit substrate having a second interconnection formed therein; bonding the first circuit substrate to the top surface of the second circuit substrate so as to be stacked facing each other; and performing an etching process of simultaneously removing parts formed on the first interconnection and the second interconnection in a stacked body of the first circuit substrate and the second circuit substrate so as to form a first opening in the top surface of the first interconnection and to form a second opening in the top surface of the second interconnection, wherein the forming of the first circuit substrate includes forming an etching stopper layer on the surface of the first interconnection out of a material having an etching rate lower than that of the first interconnection in the etching process.

(2) The method according to (1), wherein the forming of the first circuit substrate includes forming the first interconnection in a first interconnection layer when forming the first interconnection layer on the surface of a first semiconductor substrate facing the second circuit substrate, wherein the forming of the second circuit substrate includes forming the second interconnection in a second interconnection layer when forming the second interconnection layer on the surface of a second semiconductor substrate facing the first circuit substrate, wherein the bonding of the first circuit substrate to the second circuit substrate includes bonding the first interconnection layer and the second interconnection layer to each other to face each other, and wherein the performing of the etching process includes forming the first opening and the second opening so that the first opening and the second opening penetrate the first semiconductor substrate.

(3) The method according to (1) or (2), further including electrically connecting the first interconnection and the second interconnection to each other via the first opening and the second opening.

(4) The method according to any one of (1) to (3), wherein the forming of the first circuit substrate includes forming the etching stopper layer from a barrier metal material having a diffusion coefficient smaller than that of the first interconnection.

(5) The method according to any one of (1) to (4), further including thinning the first circuit substrate before forming the first opening and the second opening in the stacked body of the first circuit substrate and the second circuit substrate.

(6) The method according to any one of (1) to (5), wherein the first circuit substrate is formed as a sensor substrate in which a plurality of pixels each having a photoelectric conversion element are arranged in the forming of the first circuit substrate, and wherein the second circuit substrate is formed as a logic substrate in the forming of the second circuit substrate.

(7) The method according to (6), further including: forming a color filter for each of the plurality of pixels; and forming an on-chip lens for each of the plurality of pixels.

(8) A method of manufacturing a semiconductor device, including: forming a first circuit substrate; forming a second circuit substrate having a first interconnection and a second interconnection formed therein; bonding the first circuit substrate to the top surface of the second circuit substrate so as to be stacked facing each other; and performing an etching process of simultaneously removing parts formed on the first interconnection and the second interconnection in a stacked body of the first circuit substrate and the second circuit substrate so as to form a first opening in the top surface of the first interconnection and to form a second opening narrower than the first opening in the top surface of the second interconnection, wherein the forming of the second circuit substrate includes forming an etching stopper layer on at least the top surface of the first interconnection out of a material having an etching rate lower than that of the first interconnection in the etching process.

(9) The method according to (8), wherein the forming of the second circuit substrate includes forming the etching stopper layer on the top surface of the second interconnection in addition to the first interconnection out of a material having an etching rate lower than that of the second interconnection in the etching process.

(10) The method according to (8) or (9), wherein the forming of the first circuit substrate includes forming a first interconnection layer on the surface of a first semiconductor substrate facing the second circuit substrate, wherein the forming of the second circuit substrate includes forming a second interconnection layer on the surface of a second semiconductor substrate facing the first circuit substrate, wherein the forming of the second interconnection layer includes forming the first interconnection and the second interconnection in the second interconnection layer, wherein the bonding of the first circuit substrate to the second circuit substrate includes bonding the first interconnection layer and the second interconnection layer to each other to face each other, and wherein the performing of the etching process includes forming the first opening and the second opening so that the first opening and the second opening penetrate the first semiconductor substrate.

(11) The method according to any one of (8) to (10), wherein the first circuit substrate is formed as a sensor substrate in which a plurality of pixels each having a photoelectric conversion element are arranged in the forming of the first circuit substrate, and wherein the second circuit substrate is formed as a logic substrate in the forming of the second circuit substrate.

(12) The method according to any one of (8) to (11), further including electrically connecting the first interconnection and the second interconnection to each other via the first opening and the second opening.

(13) The method according to any one of (8) to (12), wherein the forming of the second circuit substrate includes forming the etching stopper layer from a barrier metal material having a diffusion coefficient smaller than that of the first interconnection.

(14) The method according to any one of (8) to (13), further including thinning the first circuit substrate before forming the first opening and the second opening in the stacked body of the first circuit substrate and the second circuit substrate.

(15) The method according to (14), further including: forming a color filter for each of the plurality of pixels; and forming an on-chip lens for each of the plurality of pixels.

(16) A semiconductor device including: a stacked body that includes a first circuit substrate and a second circuit substrate and in which the first circuit substrate is bonded to the top surface of the second circuit substrate so as to be stacked facing each other, wherein the stacked body includes at least a first interconnection having a first opening formed in the surface thereof and a second interconnection having a second opening formed in the surface thereof, wherein the first interconnection is disposed above the second interconnection in the stacked body, wherein the first opening and the second opening are formed through the use of an etching process of simultaneously removing parts on the first interconnection and the second interconnection, and wherein the first opening is formed by stopping the etching process by the use of an etching stopper layer formed on the top surface of the first interconnection out of a material having an etching rate lower than that of the first interconnection.

(17) A semiconductor device including: a stacked body that includes a first circuit substrate and a second circuit substrate and in which the first circuit substrate is bonded to the top surface of the second circuit substrate so as to be stacked facing each other, wherein the stacked body includes at least a first interconnection having a first opening formed in the surface thereof and a second interconnection having a second opening being narrower than the first opening and being formed in the surface thereof, wherein the first opening and the second opening are formed through the use of an etching process of simultaneously removing parts on the first interconnection and the second interconnection, and wherein the first opening is formed by stopping the etching process by the use of an etching stopper layer formed on the top surface of the first interconnection out of a material having an etching rate lower than that of the first interconnection.

(18) An electronic apparatus including: a stacked body that includes a first circuit substrate and a second circuit substrate and in which the first circuit substrate is bonded to the top surface of the second circuit substrate so as to be stacked facing each other, wherein the stacked body includes at least a first interconnection having a first opening formed in the surface thereof and a second interconnection having a second opening formed in the surface thereof, wherein the first interconnection is disposed above the second interconnection in the stacked body, wherein the first opening and the second opening are formed through the use of an etching process of simultaneously removing parts on the first interconnection and the second interconnection, and wherein the first opening is formed by stopping the etching process by the use of an etching stopper layer formed on the top surface of the first interconnection out of a material having an etching rate lower than that of the first interconnection.

(19) An electronic apparatus including: a stacked body that includes a first circuit substrate and a second circuit substrate and in which the first circuit substrate is bonded to the top surface of the second circuit substrate so as to be stacked facing each other, wherein the stacked body includes at least a first interconnection having a first opening formed in the surface thereof and a second interconnection having a second opening being narrower than the first opening and being formed in the surface thereof, wherein the first opening and the second opening are formed through the use of an etching process of simultaneously removing parts on the first interconnection and the second interconnection, and wherein the first opening is formed by stopping the etching process by the use of an etching stopper layer formed on the top surface of the first interconnection out of a material having an etching rate lower than that of the first interconnection.

The present disclosure contains subject matter related to that disclosed in Japanese Priority Patent Application JP 2011-087053 filed in the Japan Patent Office on Apr. 11, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device, comprising:
    forming a first circuit substrate having a first interconnection formed therein;
    forming a second circuit substrate having a second interconnection formed therein;
    bonding the first circuit substrate to the top surface of the second circuit substrate so as to be stacked facing each other; and
    performing an etching process of simultaneously removing parts formed on the first interconnection and the second interconnection in a stacked body of the first circuit substrate and the second circuit substrate so as to form a first opening on the top surface of the first interconnection and to form a second opening on the top surface of the second interconnection,
    wherein the forming of the first circuit substrate includes forming an etching stopper layer on the surface of the first interconnection out of a material having an etching rate lower than that of the first interconnection in the etching process.

2. The method according to claim 1, wherein the forming of the first circuit substrate includes forming the first interconnection in a first interconnection layer when forming the first interconnection layer on the surface of a first semiconductor substrate facing the second circuit substrate,
    wherein the forming of the second circuit substrate includes forming the second interconnection in a second interconnection layer when forming the second interconnection layer on the surface of a second semiconductor substrate facing the first circuit substrate,
    wherein the bonding of the first circuit substrate to the second circuit substrate includes bonding the first interconnection layer and the second interconnection layer to each other to face each other, and
    wherein the performing of the etching process includes forming the first opening and the second opening so that the first opening and the second opening penetrate the first semiconductor substrate.

3. The method according to claim 1, further comprising electrically connecting the first interconnection and the second interconnection to each other via the first opening and the second opening.

4. The method according to claim 1, wherein the forming of the first circuit substrate includes forming the etching stopper layer from a barrier metal material having a diffusion coefficient smaller than that of the first interconnection.

5. The method according to claim 1, further comprising thinning the first circuit substrate before forming the first opening and the second opening in the stacked body of the first circuit substrate and the second circuit substrate.

6. The method according to claim 1, wherein the first circuit substrate is formed as a sensor substrate in which a plurality of pixels each having a photoelectric conversion element are arranged in the forming of the first circuit substrate, and
    wherein the second circuit substrate is formed as a logic substrate in the forming of the second circuit substrate.

7. The method according to claim 6, further comprising:
    forming a color filter for each of the plurality of pixels; and
    forming an on-chip lens for each of the plurality of pixels.

* * * * *